US012655548B2

(12) United States Patent
Fink et al.

(10) Patent No.: US 12,655,548 B2
(45) Date of Patent: Jun. 16, 2026

(54) HIGHLY SENSITIVE ACOUSTIC FABRIC INCLUDING AN ACOUSTIC FIBER TRANSDUCER

(71) Applicant: Massachusetts Institute of Technology, Cambridge, MA (US)

(72) Inventors: Yoel Fink, Brookline, MA (US); Wei Yan, Singapore (SG)

(73) Assignee: Massachusetts Institute of Technology, Cambridge, MA (US)

( * ) Notice: Subject to any disclaimer, the term of this patent is extended or adjusted under 35 U.S.C. 154(b) by 792 days.

(21) Appl. No.: 18/021,619

(22) PCT Filed: Jul. 9, 2021

(86) PCT No.: PCT/US2021/041080
§ 371 (c)(1),
(2) Date: Feb. 16, 2023

(87) PCT Pub. No.: WO2022/055610
PCT Pub. Date: Mar. 17, 2022

(65) Prior Publication Data
US 2023/0304197 A1 Sep. 28, 2023

Related U.S. Application Data

(60) Provisional application No. 63/076,433, filed on Sep. 10, 2020.

(51) Int. Cl.
*H10N 30/857* (2023.01)
*D03D 1/00* (2006.01)
(Continued)

(52) U.S. Cl.
CPC ......... *D03D 1/0088* (2013.01); *H04R 17/005* (2013.01); *H10N 30/702* (2024.05);
(Continued)

(58) Field of Classification Search
CPC .......................... H10N 30/857; H10N 30/702
See application file for complete search history.

(56) References Cited

U.S. PATENT DOCUMENTS

| | | | |
|---|---|---|---|
| 3,854,112 A | 12/1974 | Greenwood |
| 3,975,698 A | 8/1976 | Redman |

(Continued)

FOREIGN PATENT DOCUMENTS

| | | | |
|---|---|---|---|
| CN | 104233579 A | 12/2014 |
| CN | 108442038 A | 8/2018 |

(Continued)

OTHER PUBLICATIONS

Xu et al., "Flexible and transparent graphene-based loudspeakers," Appl. Phys. Lett., vol. 102, pp. 151902:1-4, Apr. 2013.
(Continued)

*Primary Examiner* — Bryan P Gordon
(74) *Attorney, Agent, or Firm* — Theresa A. Lober

(57) ABSTRACT

The acoustic fiber transducer has a piezoelectric domain with Young's modulus, $E_{piezo}$, and including a non-centrosymmetric crystalline-phase piezoelectric material and inorganic piezoelectric particles. At least one charge collector domain is in electrical connection with the piezoelectric domain and includes an electrically conductive material operative to collect electrical charge generated in the piezoelectric domain. At least one electrical conductor is in electrical contact with the at least one charge collector domain and includes an electrically conductive material operative to transport electrical charge from a charge collector domain to an end of the acoustic fiber transducer as an electrical signal indicative of input acoustic sound pressure on a matrix of textile fibers that includes the acoustic fiber transducer. Outer acoustic energy transmission material has a Young's modulus $E_{trans}$, of 0.3 Pa-500 MPa, for matching
(Continued)

vibrational modes of the textile fiber matrix. A ratio of $E_{piezo}/E_{trans}$ is between about 5 and about 70,000.

40 Claims, 15 Drawing Sheets

(51) Int. Cl.
    *H04R 17/00*     (2006.01)
    *H10N 30/00*     (2023.01)

(52) U.S. Cl.
    CPC ....... *H10N 30/857* (2023.02); *D10B 2201/02* (2013.01); *D10B 2331/021* (2013.01); *D10B 2401/061* (2013.01); *D10B 2401/16* (2013.01); *D10B 2401/18* (2013.01); *H04R 2217/01* (2013.01)

(56) References Cited

U.S. PATENT DOCUMENTS

| | | |
|---|---|---|
| 4,726,651 A | 2/1988 | Wei et al. |
| 4,742,318 A | 5/1988 | Jen et al. |
| 4,823,041 A | 4/1989 | Inoue et al. |
| 5,072,035 A | 12/1991 | Chen et al. |
| 5,135,295 A | 8/1992 | Jen et al. |
| 5,152,291 A | 10/1992 | Dias |
| 5,636,299 A | 6/1997 | Bueno et al. |
| 5,867,268 A | 2/1999 | Gelikonov et al. |
| 6,337,835 B1 | 1/2002 | Sporn et al. |
| 6,385,377 B1 | 5/2002 | Brueck et al. |
| 6,403,161 B1 | 6/2002 | Sporn |
| 6,620,287 B2 | 9/2003 | Cass |
| 6,694,817 B2 | 2/2004 | Degertekin et al. |
| 6,779,387 B2 | 8/2004 | Degertekin |
| 6,801,698 B2 | 10/2004 | King et al. |
| 6,990,853 B2 | 1/2006 | Elrod |
| 7,047,800 B2 | 5/2006 | Thiesen et al. |
| 7,292,758 B2 | 11/2007 | Bayindir et al. |
| 7,295,734 B2 | 11/2007 | Bayindir et al. |
| 7,567,740 B2 | 7/2009 | Bayindir et al. |
| 7,629,727 B2 | 12/2009 | Whinnery |
| 7,805,029 B2 | 9/2010 | Bayindir et al. |
| 7,834,527 B2 | 11/2010 | Alvarez Icaza Rivera et al. |
| 8,098,966 B2 | 1/2012 | Bayindir et al. |
| 8,406,889 B2 | 3/2013 | Llinas et al. |
| 8,716,920 B2 | 5/2014 | Kim et al. |
| 8,863,556 B2 | 10/2014 | Bayindir et al. |
| 8,946,974 B2 | 2/2015 | Yu et al. |
| 9,263,614 B2 | 2/2016 | Deng et al. |
| 9,365,013 B2 | 6/2016 | Fink et al. |
| 9,512,036 B2 | 12/2016 | Abouraddy et al. |
| 9,861,810 B2 | 1/2018 | Anikeeva et al. |
| 10,112,321 B2 | 10/2018 | Gumennik et al. |
| 10,338,000 B2 | 7/2019 | Gumennik et al. |
| 10,406,723 B2 | 9/2019 | Fink et al. |
| 10,509,186 B2 | 12/2019 | Fink et al. |
| 10,756,251 B2 | 8/2020 | Kim et al. |
| 10,978,217 B2 | 4/2021 | Fink et al. |
| 11,260,586 B2 | 3/2022 | Fink et al. |
| 11,269,149 B2 | 3/2022 | Fink et al. |
| 2002/0182397 A1 | 12/2002 | Whatley |
| 2003/0141785 A1 | 7/2003 | Sato et al. |
| 2003/0169315 A1 | 9/2003 | Pickrell |
| 2004/0123946 A1 | 7/2004 | Cass |
| 2005/0053345 A1 | 3/2005 | Bayindir et al. |
| 2006/0236777 A1 | 10/2006 | Chambers et al. |
| 2007/0019917 A1 | 1/2007 | Bayindir et al. |
| 2008/0087047 A1 | 4/2008 | Bayindir et al. |
| 2009/0056094 A1 | 3/2009 | Shi et al. |
| 2009/0085444 A1* | 4/2009 | Alvarez Icaza Rivera ................. H10N 30/206 310/365 |
| 2009/0097805 A1* | 4/2009 | Bayindir ............ G02B 6/02361 385/101 |
| 2009/0169158 A1 | 7/2009 | Bayindir et al. |
| 2010/0097292 A1 | 4/2010 | Peczalski |
| 2010/0316088 A1 | 12/2010 | Bayindir et al. |
| 2010/0331941 A1 | 12/2010 | Walsh et al. |
| 2014/0025007 A1* | 1/2014 | Fink .................... H10N 30/702 428/394 |
| 2017/0029985 A1 | 2/2017 | Tajitsu et al. |
| 2018/0108826 A1 | 4/2018 | Tajitsu et al. |
| 2019/0003905 A1 | 1/2019 | Yoshida et al. |
| 2019/0047240 A1 | 2/2019 | Sorin et al. |
| 2019/0267538 A1 | 8/2019 | Yoshida et al. |
| 2019/0273199 A1* | 9/2019 | Tajitsu ..................... D04B 1/16 |
| 2020/0028198 A1 | 1/2020 | Lee |
| 2021/0201121 A1 | 7/2021 | Fink et al. |

FOREIGN PATENT DOCUMENTS

| | | |
|---|---|---|
| EP | 0703266 A1 | 3/1996 |
| JP | 4922482 B2 | 4/2012 |
| KR | 102036363 B1 | 10/2019 |

OTHER PUBLICATIONS

Yagi et al., "Transition Behavior and Dielectric Properties in Trifluoroethylene and Vinylidene Fluoride Copolymers," Polymer Journal, vol. 12, No. 4, pp. 209-223, 1980.

Yamada et al., "Ferroelectric-to-paraelectric phase transition of vinylidene fluoride-trifluoroethylene copolymer," J. Appl. Phys., vol. 52, No. 2, pp. 948-952, Feb. 1981.

Yan et al., "Advanced Multimaterial Electronic and Optoelectronic Fibers and Textiles," Adv. Mater. vol. 31, pp. 1802348:1-28, Sep. 2018.

Yang et al., "Triboelectrification-Based Organic Film Nanogenerator for Acoustic Energy Harvesting and Self-Powered Active Acoustic Sensing," ACS Nano, vol. 8, No. 3 pp. 2649-2657, Feb. 2014.

Yan et al., "Thermally drawn advanced functional fibers: New frontier of flexible electronics," Materials Today, vol. 35, pp. 168-194, May 2020.

Zhang et al., "Giant Electrostriction and Relaxor Ferroelectric Behavior in Electron-Irradiated Poly(vinylidene fluoride-trifluoroethylene) Copolymer," Science, vol. 280, pp. 2101-2104, Jun. 1998.

Nunes-Pereira et al., "Energy harvesting performance of BaTiO3/poly(vinylidene fluoride-trifluoroethylene) spin coated nanocomposites," Composites Part B: Engineering, vol. 72, pp. 130-136, Apr. 2015.

Hu et al., "Improved Piezoelectric Sensing Performance of P(VDF-TrFE) Nanofibers by Utilizing BTO Nanoparticles and Penetrated Electrodes," ACS Appl. Mater. Interfaces, vol. 11, No. 7, pp. 7379-7386, Jan. 2019.

Guan et al., "Hierarchically architected polydopamine modified BaTiO3@P(VDF-TrFE) nanocomposite fiber mats for flexible piezoelectric nanogenerators and self-powered sensors," Nano Energy, vol. 70, pp. 104516:1-13, Apr. 2020.

Xie et al., "Fabrication of Stretchable Nanocomposites with High Energy Density and Low Loss from Cross-Linked PVDF Filled with Poly(dopamine) Encapsulated BaTiO3," ACS Appl. Mater. Interfaces, vol. 9, No. 3, pp. 2995-3005, Jan. 2017.

PCT/US2021/41080, PCT Written Opinion of the International Searching Authority, Form PCT/ISA/237 cover sheet, Box No. 1 sheet, Box No. V sheet, Box No. VII sheet, and Supplemental Box sheet, Oct. 2021.

PCT/US2021/41080, PCT International Search Report, Form PCT/ISA/210 first sheet and second sheet, Oct. 2021.

Abouraddy et al., "Towards multimaterial multifunctional fibres that see, hear, sense and communicate," Nature Materials, vol. 6, pp. 344, May 2007.

Abouraddy et al., "Large-scale optical-field measurements with goemetric fibre constructs," Nature Materials, vol. 5, pp. 532-536, 2006.

Egusa et al., "Multimaterial Piezoelectric Fibres," Nature Materials, vol. 9, pp. 643-648, Published online Jul. 2010.

Bayindir et al., "Metal-insulator-semiconductor optoelectronic fibres," Nature vol. 431, pp. 826-829, Oct. 2004.

(56) References Cited

OTHER PUBLICATIONS

Bayindir et al., "Integrated fibres for self-monitored optical transport," Nature Materials vol. 4, pp. 820-825, Nov. 2005.

Carpi et al., "Electroactive Polymer-Based Devices for e-Textiles in Biomedicine," IEEE Trans. Inf. Tech in Biomedicine, vol. 9, No. 3, pp. 295-318, Sep. 2005.

Clemens et al., "Computing Fibers: A Novel Fiber for Intelligent Fabrics?," Adv. Eng. Mats. vol. 5, No. 9, pp. 682, 2003.

Davis et al., "Electric-field-induced phase changes in poly(vinylidende fluoride)," J. Appl. Phys., vol. 49, No. 10, pp. 1998-5002, Oct. 1976.

Fan et al., "Ultrathin, Rollable, Paper-Based Triboelectric Nanogenerator for Acousitc Energy Harvesting and Self-Powered Sound Recording," ACS Nano, vol. 9, No. 4, pp. 4236-4243, 2015.

Fei et al., "Low-voltage Driven Graphene Foam Thermoacoustic Speaker," small, vol. 11, No. 19, pp. 2252-2256, 2015.

Chocat, "Multimaterial Acoustic Fibers," Ph.D. Thesis, p. 1-150, Massachusetts Institute of Technology, May 2013.

Furukawa, "Ferroelectric properties of vinylidene fluoride copolymers," Phase Transitions, vol. 18, pp. 143-211, Jan. 1989.

Gould, "Textiles gain intelligence," materialstoday, pp. 38-43, Oct. 2003.

Graumann et al., "Large Surface Area Electronic Textiles for Ubiquitous Computing: A System Approach," 2007 Fourth Ann. Int. Conf. on Mobile and Ubiquitous Systems: Networking & Services (Mobiquitous), Phil., PA, doi: 10.1109/MOBIQ.2007.44509792007.

Harker, "The Determination of the Phases of the Structure Factors of Non-Centrosymmetric Crystals by the Method of Double Isomorphous Replacement," Acta Cryst. vol. 9, No. 1, pp. 1-9, 1956.

Jung et al., "Flexible Piezoelectric Acoustic Sensors and Machine Learning for Speech Processing," Adv. Mater., pp. 1904020:1-18, DOI: 10.1002/adma.2019004020, 2019.

Kang et al., "Transparent and conductive nanomembranes with orthogonal silver nanowire arrays for skin-attachable loudspeakers and microphones," Sci. Adv. vol. 4, pp. 1-11, Aug. 2018.

Karle et al., "The Symbolic Addition Procedure for Phase Determination for Centrosymmetric and Noncentrosymmetric Crystals," Acta Cryst., vol. 21, pp. 849-859, 1966.

Kawai, The Piezoelectricity of Poly(vinylidene Fluoride), Japan J. Appl. Phys., vol. 8, pp. 975-976, 1969.

Kholkin et al., "Piezoelectricity and Crystal Symmetry," Chapter 2, pp. 17-38, Piezoelectric and Acoustic Materials for Transducer Applications, Safari et al., Eds., ISBN: 978-0-387-76538-9, Springer Science+Business Media, LLC, 2008.

Kim et al., "Gold Coating of a Plastic Optical Fiber Based on PMMA," Human-Computer Interaction, Part III, HCII 2009, Jacko Ed., pp. 760-767, 2009.

Kimura et al., "Ferroelectric properties of poly(vinylidenefluoride-trifluoroethylene) copolymer thin films, " Appl., Phys., Lett., vol. 43, No. 9, pp. 834-836, Nov. 1983.

Koga et al., "Piezoelectricity and related properties of vinylidene fluoride and trifluoroethylene copolymers," J. Appl. Phys. vol. 59, No. 6, pp. 2142-2150 , Mar. 1986.

Lando et al., "Nuclear Magnetic Resonance and X-Ray Determination of the Structure of Poly(vinylidene Fluoride)," Unl. Polymer Science: Part A-1, vol. 4, pp. 941-951, 1966.

Lando et al., "The Polymorphism of Poly(vinylidene fluoride). I. The Effect of Head-to-Head Structure," Macromol. Sci-Phys., vol. B2, No. 2 pp. 205-218, Jun. 1968.

Lang et al., "High-sensitivity acoustic sensors from nanofibre webs," Nature Comms., pp. 1-7, DOI: 10.1038/ncomms11108, Mar. 2016.

Lee et al., "An ultrathin conformable vibration-responsive electronic skin for quantitative vocal recognition," Nature Comms., pp. 1-11, DOI: 10.1038/s41467-019-10465-w, 2019.

Li et al., "Nanogenerator-based dual-functional and self-powered thin patch loudspeaker or microphone for flexible electronics," Nature Comms. pp. 1-9, DOI: 10.1038/ncomms15310, May 2017.

Loke et al., "Recent Progress and Perspectives of Thermally Drawn Multimaterial Fiber Electronics," Adv. Mater., p. 1904911:1-30. DOI: 10.1002/adma201904911, 2019.

Loke et al., "Computing Fabrics," Matter, vol. 2, pp. 786-788, Apr. 2020.

Lovinger, "Ferroelectric Polymers," Science, vol. 220, No. 4602, pp. 1115-1121, Jun. 1983.

Lu, et al., "Piezoelectric Microstructured Fibers via Drawing of Multimaterial Preforms," Scientific Reports, vol. 7:2907, pp. 1-12, DOI:10.1038/s41598-017-01738-9, Jun. 2017.

Ma et al., "Highly Oriented Electrospun P(VDF-TrFE) Fibers via Mechanical Stretching for Wearable Motion Sensing," Adv. Mater. Technol. vol. 3, pp. 1800033:1-7, DOI: 10.1002/admt.201800033.

Matsushige et al., "The II-I crystal transformation of poly(vinylidene fluoride) under tensile and compressional stresses, " Polymer, vol. 21, pp. 1391-1397, Dec. 1980.

Nayeem et al., "All-nanofiber-based, ultrasensitive, gas-permeable mechanoacoustic sensors for continuous long-term heart monitoring," PNAS pp. 1-8, www.pnas.org/cig/doi/10.1073/pnas.1920911117, Mar. 2020.

Ngai et al., "The TeeBoard: an Education-Friendly construction Platform for E-Textiles and Wearable Computing," pp. 1-10, CHI 2009, Boston, MA, Apr. 4-9, 2009.

Omote et al., "Temperature dependence of elastic, dielectric, and piezoelectric properties of 'single crystalline' films of vinylidene fluoride trifluoroethylene copolymer," J. Appl. Phys., vol. 81, vol. 6, pp. 2760-2769, Mar. 1997.

Park et al., "Irreversible extinction of ferroelectric polarization in P(VDF-TrFE) thin films upon melting and recrystallization," Appl. Phys. Letts., vol. 88, pp. 242908:1-3, Jun. 2006.

Pinet, "Saving lives," Nature photonics, vol. 2, pp. 150-152, Mar. 2008.

Qu et al., "Superelastic Multimaterial Electronic and Photonic Fibers and Devices via Thermal Drawing," Adv. Mater., vol. 30, pp. 1707251:1-8, May 2018.

Robert et al., "Fabrication of focused poly(vinylidene fluoride-trifluoroethylene) P(VDF-TrFE) copolymer 40-50 MHZ ultrasound transducers on curved surfaces," J. Appl. Phys., vol. 96, No. 1, pp. 252-256, Jul. 2004.

Shi et al., "Smart Textile-Integrated Microelectronic Systems for Wearable Applications," Adv. Mater., vol. 32, pp. 1901958:1-37, Jul. 2019.

Townsend et al., "Measurement of the refractive-index modulation generated by electrostriction-induced acoustic waves in optical fibers," Optics Letts., vol. 21, No. 5, pp. 333-335, Mar. 1996.

Wang et al., "Direct-Current Nanogenerator Driven by Ultrasonic Waves," vol. 316, pp. 102-105, Apr. 2007.

Wang et al., "Piezoelectric Nanogenerators Based on Zinc Oxide Nanowire Arrays," Science, vol. 312, pp. 242-246, Apr. 2006.

Wegener et al., "Patterned ferro-, pyro-and piezoelectricity in poly(vinylidene fluoride) by means of a laser-induced irreversible b—a phase transformation," J. Appl. Phys., vol. 91, No. 5, pp. 3193-3196, Mar. 2002.

Wu et al., "In-Situ Simultaneous Synchrotron Small-and Wide-Angle X-ray Scattering Measurement of Poly(vinylidene fluoride) Fibers under Deformation," Macromolecules, vol. 33, pp. 1765-1777, Feb. 2000.

Xiao et al., "Flexible, Stretchable, Transparent Carbon Nanotube Thin Film Loudspeakers," Nano Letters, vol. 8, No. 12, pp. 4539-4545, Oct. 2008.

* cited by examiner

12

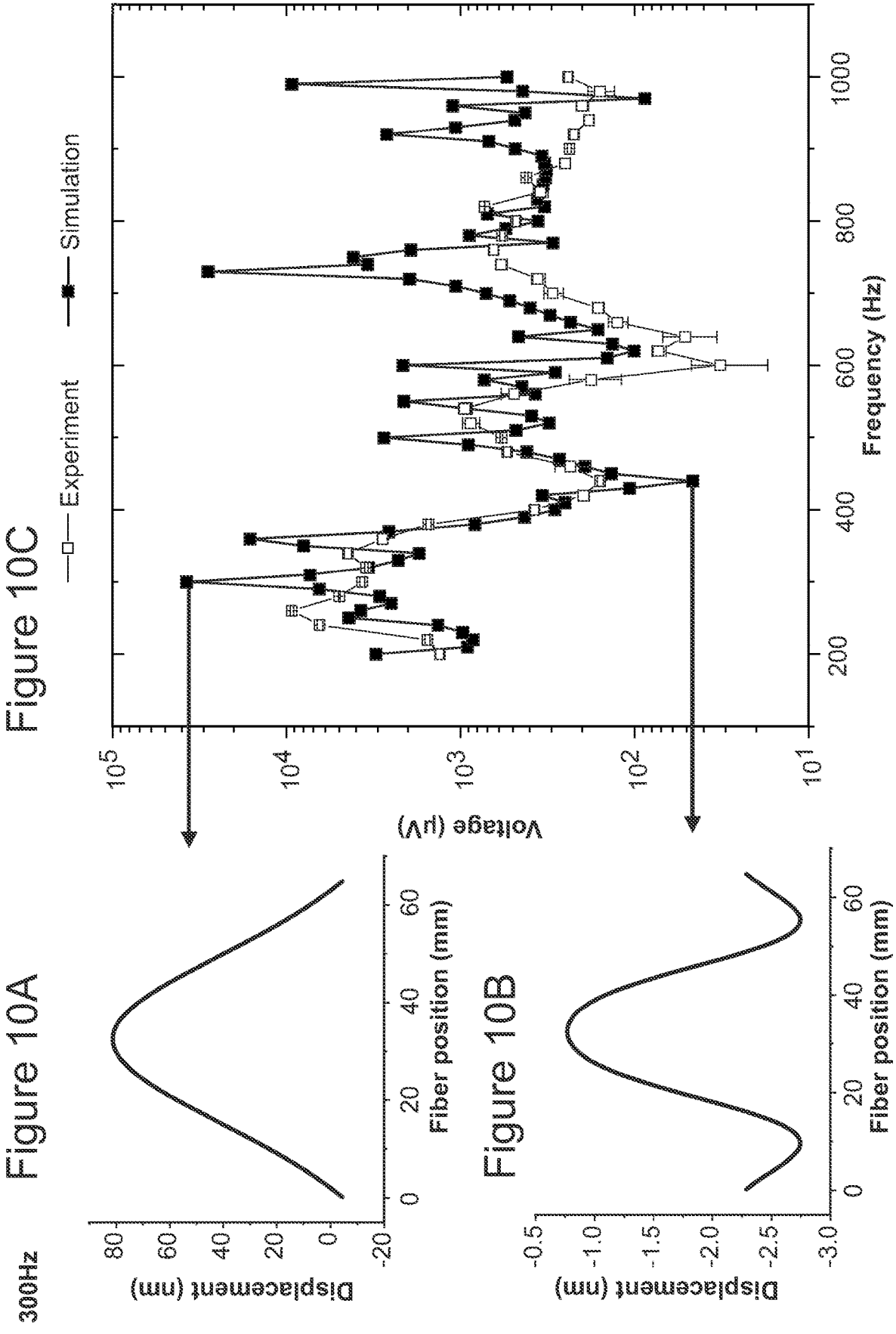

HIGHLY SENSITIVE ACOUSTIC FABRIC INCLUDING AN ACOUSTIC FIBER TRANSDUCER

CROSS-REFERENCE TO RELATED APPLICATION

This application claims the benefit of U.S. Provisional Patent Application No. 63/076,433, filed Sep. 10, 2020, the entirety of which is hereby incorporated by reference.

STATEMENT REGARDING FEDERALLY SPONSORED RESEARCH

This invention was made with Government support under Grant No. W911NF-18-2-0048, awarded by the Army Research Office (ARO). The Government has certain rights in this invention.

BACKGROUND

This invention relates generally to thermally drawn fibers, and more particularly relates to thermally drawn fibers for sensing and producing audible signals.

The human body generates a variety of sounds in the audible range. Such audible sounds carry an abundance of information that is critical for a broad range of applications. For example, voice produced via vocal fold vibration in the throat constitutes the primary means of human communication; audible acoustics from the lungs, such as wheezing, rhonchi and rales can provide an early warning of respiratory system diseases such as Covid-19; audible thermal-based sound generated by the turbulence created from blood flowing through the heart can reflect the condition of the cardiovascular system, the disease of which is recognized as the leading cause of mortality in countries throughout the world. Thus, the detection and recording of audible human body sounds is of great technological importance.

Historically, audible sounds, and human body-based audible sounds in particular, have conventionally been captured by macroscopic devices, such as microphones and stethoscopes. Although there are many successful commercial embodiments of such, their deployment remains limited for a range of important applications, including medical applications, due to the generally cumbersome arrangement of their macro-scale implementation. In recent years, there has emerged a potentially promising alternative in the form of skin-interfaced, acoustic thin-film sensors for detecting audible sounds in a more convenient way. The demonstrated success of wearable fabric configurations for storing energy, communicating, heating and cooling, color control, and even digital information storage and processing has encouraged such inquiry.

But in general, at least two obstacles limit the ability to achieve acoustically-sensitive wearable fabric. First, traditional fabric materials are notorious for damping sound. Fabrics are hierarchical constructs assembled of one or more staples such as fibers, yarns, or filaments that are knitted, bonded, twisted, braided, felted, tufted, or otherwise configured into the fabric entity. The resulting hierarchy of materials and scale inherently establishes multiple interfaces, which can scatter and dissipate propagating phonons, giving conventional fabric dissipative acoustic characteristics. Indeed, conventional fabrics have historically been exploited as sound absorbers, dissipating acoustic energy by viscous and thermal effects, for reducing noise and vibration in, e.g., transportation and civil engineering applications.

The inherent performance limitations of conventional acoustically-sensitive fibers present a second obstacle to achieving acoustically-sensitive wearable fabric. Previously-reported fibers capable of converting mechanical vibrations into electrical signals suffer from very low transduction sensitivity in air; such fibers are generally inoperable as audible sound sensors. To achieve an operable level of fiber-based audible sound transduction sensitivity in air, there is in general required a very large acoustically-active fiber area, limiting or eliminating the use of such in a fabric for wearable applications. With these obstacles, the detection and perception of faint audible sounds with a fabric form factor construct has been unachievable.

SUMMARY

Herein is provided an acoustic fabric that overcomes the limitations of conventional audible acoustic transducers to achieve superior performance with a fabric form factor. In the acoustic fabric there is provided a matrix of textile fibers. The matrix of textile fibers has a Young's modulus of at least about 1 GPa. An acoustic fiber transducer is physically coupled with the matrix of textile fibers with at least one of a coupler and a weave of the matrix of textile fibers.

The acoustic fiber transducer has a piezoelectric domain that is disposed between a first end and a second end of the acoustic fiber transducer. The piezoelectric domain includes a piezoelectric material that is in a microscopic non-centrosymmetric crystalline phase. The piezoelectric domain also includes a population of inorganic piezoelectric particles dispersed in the microscopic non-centrosymmetric crystalline piezoelectric material. The piezoelectric domain has a Young's modulus, $E_{piezo}$.

At least one charge collector domain is in electrical connection with the piezoelectric domain and includes an electrically conductive material that is operative to collect electrical charge generated in the piezoelectric domain. At least one electrical conductor is in electrical contact with the at least one charge collector domain and includes an electrically conductive material operative to transport electrical charge from the at least one charge collector domain to at least one of said first and second ends of said acoustic fiber transducer as an output of an electrical signal indicative of input acoustic sound pressure on the matrix of textile fibers and the acoustic fiber transducer.

An outer electrically insulating acoustic energy transmission material encapsulates the piezoelectric domain, charge collector domain, and electric conductor between the first and second ends of the acoustic fiber transducer. The acoustic energy transmission material has a Young's modulus $E_{trans}$, greater than about 0.3 Pa and less than about 500 MPa, for conformally matching vibrational modes of the matrix of textile fibers. A ratio of $E_{piezo}/E_{trans}$ is between about 5 and about 70,000.

The acoustic fabric and the acoustic fiber transducer included therein enable audible sound detection and production by a fiber and by fabric with superior performance for audible sound detection and production, for communication, and for a wide range of biological sensing applications. The coupling of the fiber transducer with a textile matrix in the manner provided herein results in a synergistic coupling, in which sound transduction is a collective effect enabled by the textile matrix-transducer coupling. Other features and advantages will be apparent from the following description and accompanying drawings, and from the claims.

BRIEF DESCRIPTION OF THE DRAWINGS

FIG. 10A is a plot of simulated displacement contour of the fiber transducer of FIG. 2 as-disposed on a membrane having a modulus of 12.67 GPa at a resonance peak at 300 Hz FIG. 10B is a plot of simulated displacement contour of the fiber transducer of FIG. 2 as-disposed on a membrane having a modulus of 12.67 GPa at a resonance peak 440 Hz;

FIG. 10C is a plot the simulated output voltage as a function of input sound frequency for the fiber transducer of FIG. 2 as-disposed on a membrane having a modulus of 12.67 GPa and is a plot of the measured output voltage as a function of input sound frequency for the fiber transducer of FIG. 2 as-disposed on a Mylar membrane;

DETAILED DESCRIPTION

Figures 1, 2A, 2B:
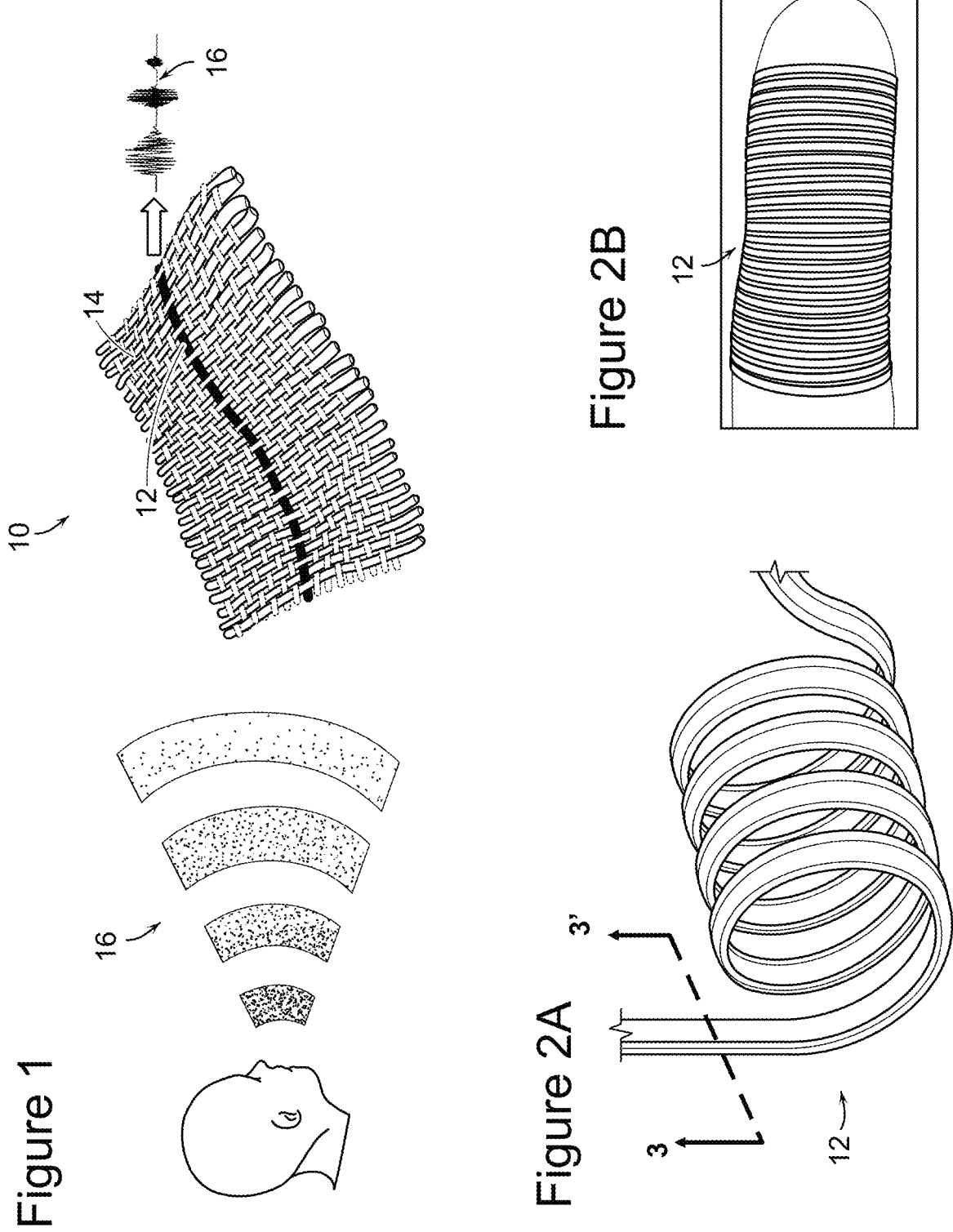
FIG. 1 is a schematic view of an acoustic fabric including a fiber transducer, both as provided herein, in operation to produce and electrical output indicative of acoustic sound input.
FIG. 2A is a schematic view of the fiber transducer of FIG. 1.
FIG. 2B is a photograph of the fiber transducer of FIG. 1, here wrapped around a finger.

Referring to FIG. 1, in one embodiment provided herein, acoustic fabric 10 includes at least one acoustic fiber transducer 12, or length of fiber transducer, that is configured with one or more lengths of textile fibers 14 in a substantially planar arrangement as an area of acoustic fabric 10. Acoustic sound pressure waves 16 produced by, e.g., human speech in air, and having a characteristic sound pressure, such as about $10^{-7}$ atm, transmit through the environment to the acoustic fabric, where the sound pressure is transduced to mechanical vibrations of the fiber transducer 12 and the textile fibers 14, which couple their vibration to the fiber transducer 12. The acoustic fiber transducer produces an electrical output 18, such as an electrical signal, indicative of the sound pressure. The acoustic fabric thereby converts an input of sound pressure input into an output of an electrical signal 18, whereby input mechanical energy is converted into output electrical energy.

As explained in detail below, the synergistic cooperation between the fiber transducer 12 and the matrix of textile fibers 14 results in acoustic fabric 10 that is highly sensitive to audible sound to a degree that has heretofore been unachievable with the form factor of planar fabric; this is in large part due to the fiber transducer's ability to very efficiently convert the energy of mechanical bending modes of the textile fiber matrix into an electrical output. It is demonstrated herein that the fiber transducer 12 and acoustic fabric 10 formed thereof are capable of detecting and recording the human voice with an operational performance on par with conventional bulky microphones.

The materials and structure of the fiber transducer 12 are entirely compatible with conventional fabric manufacturing methods for production of the acoustic fabric, such as machine weaving or knitting, embroidery, or other textile-based arrangement, being highly flexible and soft. The fiber transducer has a length, as-formed, of at least 10 meters, and in one embodiment, has a length of at least about one hundred meters, facilitating machine weaving into fabrics. The human body is routinely covered by fabrics that are continuously exposed to audible human-generated sounds, and the building blocks of fabrics are fibers and yarns of mechanical compliance with the human skin. As a result, the fiber transducer provided herein, being seamlessly integrated with textile fabrics and capable of efficiently detecting these audible sounds, is far reaching, across fields ranging from acoustics and communications, to security, human-machine interaction and the Internet of Things, and physiological and pathological interrogation.

Figure 2C:
FIG. 2C is a photograph of a section of the fiber transducer of FIG. 1, here twisted along the length of the section.

Referring to FIG. 2A, the fiber transducer 12 is a stand-alone, three-dimensional structure that extends along a first direction, the fiber transducer axis. In one embodiment, the length, L, of the fiber transducer is at least about 10 meters; in other embodiments, the fiber transducer length is at least about 50 meters; in other embodiments, the fiber transducer length is at least about 100 meters. The fiber transducer 12 is mechanically flexible, as indicated in FIG. 2A. As shown in FIG. 2B, the fiber transducer 12 can be flexibly wrapped around a small radius, such as that of a finger. As shown in FIG. 2C, the fiber transducer 12 can be twisted along the length of the transducer in the manner of yarn.

Figure 3:
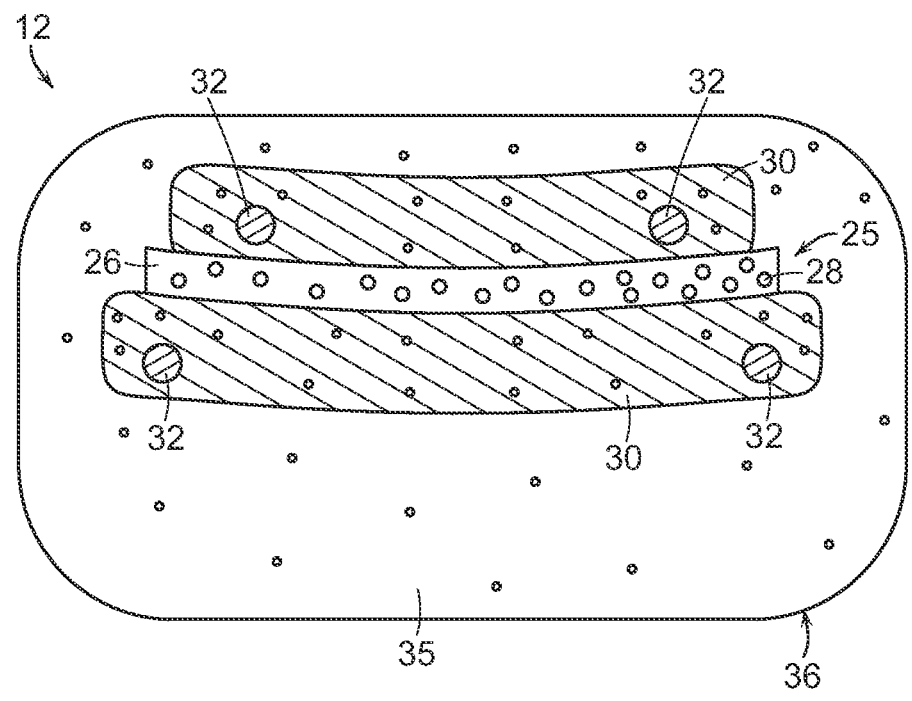
FIG. 3 is a cross-sectional view of the fiber transducer of FIG. 1 and FIG. 2A, taken at the cross section indicated in FIG. 2A.

Referring also to FIG. 3, which is a cross-sectional view taken as shown in FIG. 2A, the fiber transducer has a cross section orthogonal to the fiber transducer axis, with a cross-sectional dimension extending along a second direction orthogonal to the first direction. In embodiments herein, the fiber transducer has a maximum cross-sectional dimension of about 2 mm or less; in other embodiments the fiber transducer has a maximum cross-sectional dimension of about 1.5 mm or less; in further embodiments, the fiber transducer has a maximum cross-sectional dimension of about 1 mm or less, or about 0.5 mm or less, or about 0.25 mm or less, or about 0.1 mm or less, or about 50 microns or less, or about 10 microns or less, or about 5 microns or less. In embodiments herein, the fiber transducer has a maximum cross-sectional dimension that is no greater than the cross-sectional dimension of textile fibers with which the fiber transducer forms the acoustic fabric. In one such embodiment, textile fibers having a diameter of between about ten microns and about 900 microns are included in an acoustic fabric with a fiber transducer having a diameter of between about ten microns and about 900 microns.

In embodiments herein, the length of the fiber transducer along the first direction is larger than the fiber transducer's maximum cross-sectional dimension by a factor of at least 1000. In certain embodiments, a ratio of the fiber transducer length, L, to the fiber's maximum cross-sectional dimension is at least $10^3$, in embodiments herein this ratio is at least about $10^4$, or at least about $10^5$, or at least about $10^6$, or at least about $10^9$, or at least about $10^{12}$.

The fiber transducer cross-sectional geometry is in embodiments herein generally rectangular, or generally square, or generally circular. The cross-sectional geometry is in other embodiments tailored to optimize integration of the fiber transducer with textile fibers in the acoustic fabric matrix. In other embodiments, the cross-sectional geometry of the fiber transducer is symmetric or is non-symmetric, is regular or irregular.

In order to hear sound, human ears rely on fiber-shaped nerves that turn physical vibration into electrical signals.

Inspired by this, the fiber transducer provided herein includes a material that is capable of converting mechanical vibrational energy into electric energy. In some embodiments, the fiber transducer herein includes one or more piezoelectric materials. Piezoelectric materials in general are materials that exhibit the piezoelectric effect. The piezoelectric effect provides for the conversion of electrical energy to acoustic energy. When a mechanical stress or strain is applied to a piezoelectric material, the material generates an electrical signal in the form of surface charge. This is referred to as the direct piezoelectric effect. The reverse piezoelectric effect occurs when a variable electric field is applied to a piezoelectric material that produces an acoustic signal in the form of a mechanical stress or strain waveform in the piezoelectric material. Thus, a piezoelectric material is a material that generates an electrical signal in response to an applied mechanical stress or strain and that generates an acoustic signal in response to an applied electric field.

In embodiments provided herein, the fiber transducer includes within the fiber transducer body, that is, internal to the exterior surface of the fiber transducer, a piezoelectric material domain that is in a microscopic non-centrosymmetric crystalline phase, that is, is a non-centrosymmetric material. A non-centrosymmetric material is a material having a microscopic structure that lacks inversion symmetry, which is clearly characterized, determined, and known, by x-ray diffraction spectra of the material, and therefore that is operative to exhibit macroscopic polarization. Non-centrosymmetric materials in the fiber transducer disclosed herein preferably are non-centrosymmetric at the time the fiber transducer is formed. In other embodiments, such non-centrosymmetric materials can be centrosymmetric at the time of fiber transducer production and later rendered non-centrosymmetric by a suitable process, such as by crystallization from a molten amorphous phase into a non-centrosymmetric crystalline solid phase. But in some embodiments it is preferred that the fiber transducer include a material that is non-centrosymmetric at the time the fiber is formed.

In embodiments herein, the non-centrosymmetric material within the fiber transducer is a polymer or a copolymer. In embodiments herein, a piezoelectric polymer and/or piezoelectric copolymer material is provided in a piezoelectric domain of the fiber transducer; with the piezoelectric, non-centrosymmetric material being one of, but not limited to, poly(vinylidene fluoride) materials, copolymers of vinylidene fluoride and trifluoroethylene, polyvinyl chloride materials, copolymers of vinyl acetate and vinylidene cyanide, nylon polymer materials, nylon copolymer materials, polyacrylonitrile materials, and high temperature ceramic materials, including lead zirconate titanate, quartz, barium titanate, and cadmium sulfide. In certain embodiments, combinations of two or more materials form the non-centrosymmetric material; in one embodiment, the combination is formed of material layers; in another embodiment, the combination is formed of particulates dispersed in a host matrix.

In one embodiment herein, a piezoelectric poly(vinylidene fluoride) copolymer is the non-centrosymmetric material. In one embodiment, the copolymer polyvinylidene-fluoride-trifluoroethylene (P(VDF-TrFE)) is the non-centrosymmetric material, and includes about 30 mol % TrFE (FC30). In other embodiments, there is included about 20 mol % TrFE (FC20), or about 25 mol % TrFE (FC25), or about 45 mol % TrFE (FC45), or in other embodiments, includes between about 20 mol % and about 45 mol % TrFE.

In embodiments herein, Poly(vinylidene fluoride) (PVDF) is the non-centrosymmetric material. PVDF is a semi-crystalline polymer existing in five different crystal phases: $\alpha$, $\beta$, $\gamma$, $\delta$, and $\epsilon$. The $\alpha$ and $\beta$ phases are the most common, but only the $\beta$ phase exhibits a piezoelectric effect. The $\alpha$ phase is not piezoelectric, but it can be transformed to the $\beta$ phase by mechanical stretching and subsequent poling. Copolymerization with trifluoroethylene induces strong steric hindrance and enhances the $\beta$ phase conformation. Direct cooling of molten PVDF typically yields the phase $\alpha$-PVDF, which is not a piezoelectric phase. Thus, for many applications, PVDF is not preferred as a non-centrosymmetric material. In contrast, the PVDF copolymer poly(vinylidene fluoride—trifluoroethylene) (P(VDF-TrFE)) spontaneously solidifies into a piezoelectric and ferroelectric $\beta$-phase when cooled from molten form, and for many embodiments P(VDF-TrFE) is therefore preferred.

P(VDF-TrFE) exhibits excellent mechanical flexibility and is compatible with the mechanical properties of yarn-based textile fabrics and other textile fiber-based fabrics, and its unique capability of spontaneous solidification into the non-centrosymmetric piezoelectric $\beta$ phase from the melt is particularly advantageous. But it is discovered herein that the piezoelectric properties of P(VDF-TrFE) limit its function as a sound transducer for some applications. Conventional P(VDF-TrFE) material that results from production by spin coating, hot pressing, stamping, and spraying exhibits a very poor piezoelectric coefficient $d_{33}$ of only about 30 pC/N and a piezoelectric coefficient $d_{31}$ of only about 12 pC/N.

It is discovered herein that the very low piezoelectric capability of conventional P(VDF-TrFE), or any other selected piezoelectric polymer, is addressed by the addition of particles of an inorganic piezoelectric material to the piezoelectric polymer. In embodiments herein, exemplary materials the particles of which are included in a piezoelectric polymer matrix are, without limitation, barium titanate ($BaTiO_3$) and lead zirconate titanate (PZT), lead zirconate titanate ($Pb[Zr(x)Ti(1-x)]O_3$), doped $BaTiO_3$, a $(Ba,Ca)(Zr,Ti)O_3$ system, a $(Ba,Ca)(Sn,Ti)O_3$ system, a $(Ba,Ca)(Hf,Ti)O_3$ system, and other systems. Additional particle materials are $BaTiO_3$-based piezoelectrics.

While such particles possess a very high level of piezoelectricity, they are mechanically rigid and exhibit relatively very high melting points. Both of these characteristics are incompatible with many fiber production processes, such as thermal drawing. The volume fraction of the inorganic piezoelectric particles included in a piezoelectric polymer matrix therefore is preferably that volume fraction which maintains mechanical integrity of the piezoelectric polymer matrix-piezoelectric particle composite through a thermal drawing process while enhancing the piezoelectric properties of the composite.

In embodiments provided herein, the volume fraction of piezoelectric particles included in a polymer matrix is between about 0% and about 10% volume fraction, or is greater than 0% and less than about 7% volume fraction, or is between about 3% and about 7% volume fraction, or is between about 5% and about 6% volume fraction. The piezoelectric particles are polycrystalline or monocrystalline; monocrystalline particles are preferred for most applications. In one embodiment, for a selected piezoelectric polymer matrix material and a selected piezoelectric particle material, there is determined the electric polarization that is exhibited by the composite, as a function of applied electric field, for a range of piezoelectric particle volume fractions. This determination can be made experimentally or through simulation. With this determination, in one embodiment the volume fraction of piezoelectric particles in a piezoelectric polymer matrix is that volume fraction operative to maximize electric polarization of the matrix-particle composite. For example, for a P(VDF-TrFE)-$BaTiO_3$ composite, in embodiments herein, a volume fraction of about 5.57% $BaTiO_3$ particles is preferred. This leverages the mechanical flexibility of P(VDF-TrFE) and high piezoelectric performance of $BaTiO_3$. In other embodiments, as described below, a 20 wt % loading of $BaTiO_3$ particles can be preferred. In one preferred embodiment, a volume fraction of between about 1% and about 6% $BaTiO_3$ particles is preferred.

In embodiments herein, the size of the piezoelectric particles is also controlled to optimize manufacturing and operation. In one embodiment, the piezoelectric particles have an extent of between about 5 nm and about 200 nm. In another embodiment the piezoelectric particles have an extent of no more than about 200 nm. In preferred embodiments, the piezoelectric particles are substantially homogeneously distributed throughout the piezoelectric polymer matrix material.

It is to be recognized as-provided herein that in addition to the use of inorganic piezoelectric particles to enhance the piezoelectric capability of a piezoelectric polymer matrix, the weight percentage of the $\beta$-phase of piezoelectric polymer matrix directly impacts the operational performance of the piezoelectric matrix-particle composition. It is discovered herein that the production process of thermal drawing is uniquely suited to enhance $\beta$-phase formation in a piezoelectric polymer matrix. The combination of tensile stress and shear stress that develops at the neck-down region of a P(VDF-TrFE) preform during thermal drawing aligns the polymer chains of P(VDF-TrFE) along the drawing direction and enhances piezoelectric $\beta$-phase formation. The polymer chain in the preform are randomly distributed. Due to the tensile and shear stress of thermal drawing, the c-axis, which is the molecular chain axis, of a drawn composite fiber domain of a P(VDF-TrFE)-particle composition is preferentially aligned parallel to the fiber draw direction. This unexpectedly causes the weight percentage of the $\beta$-phase in the drawn P(VDF-TrFE)-BTO domain to increase substantially. In one embodiment, the weight percentage of the $\beta$-phase in a piezoelectric domain is greater than 30%. In one embodiment, the weight percentage of the $\beta$-phase in a piezoelectric domain is greater than 40%, or is greater than 45%.

Considering implementations of this piezoelectric domain, and turning to FIG. 3, in embodiments herein, a population of piezoelectric particles in a piezoelectric polymer matrix form a piezoelectric domain 25 of the fiber transducer 12. More specifically, the piezoelectric domain 25 of the fiber transducer includes, within the fiber transducer body, a piezoelectric non-centrosymmetric polymer matrix 26 in which is distributed a volume fraction of piezoelectric particles 28. In embodiments herein the piezoelectric domain has a thickness, within the fiber transducer body, of between about five microns and about 100 microns, and a lateral width, within the fiber transducer body, of between about 100 microns and about 2 mm.

Adjacent to the piezoelectric domain 25 in the cross-section of the fiber transducer, on each of two opposite sides of the piezoelectric domain, is a charge collector domain 30. In one example but non-limiting embodiment, a charge collector domain 30 is provided on each of two opposite sides of a generally rectangular piezoelectric domain 25. In preferred embodiments, the material of each charge collector domain 30 is in intimate physical contact with the piezoelectric domain 25. In further preferred embodiments, the outer surface of each charge collector domain 30 is mechanically in contact with the outer surface of the piezoelectric domain 25. In further preferred embodiment, the outer surface of each charge collector domain 30 is adhered to a surface of the piezoelectric domain 25.

The material of each of the charge collector domains collects electrical charge carriers from the piezoelectric domain that are generated by the piezoelectric domain through a piezoelectric effect in response to an input to that domain. In order to efficiently collect electrical charge from the piezoelectric domain, the charge collector domains preferably cover a maximum area of piezoelectric domain surface opposite each other. In preferred embodiment, the charge collector domain material is a polymer or is polymer-based, to maintain mechanical integrity of the fiber transducer during production by, e.g., thermal draw. A metal or metal-based charge collector domain is not operable because such would melt during thermal production processes such as a thermal draw step. But the charge collector domains each provide sufficient electrical conductivity to collect and deliver electrical charge from the piezoelectric domain. In one embodiment, each charge collector domain exhibits a conductivity of at least about 0.1 S/m.

In embodiments herein, the charge collector domains are each formed of carbon-loaded polyethylene (CPE), carbon-loaded polycarbonate (CPC), carbon-loaded styrene-ethylene-butylene-styrene (CSEBS), or other suitable materials. In embodiments herein, each charge collector domain has a thickness of between about five microns and 500 microns and a width of between about microns and 2 mm, given piezoelectric domain dimensions of between about five microns and about 100 microns in thickness and between about 100 microns and about 2 mm in width. In embodiments herein, a carbon particle loading volume of between about 1% volume and about 10% volume can be preferred.

As shown in FIG. 3, each charge collector domain 30 is in turn in electrical contact with at least one electrical conductor 32, such as wires, for applying an electric field along the piezoelectric domain of the fiber transducer length and for transporting electrical charges from the charge collectors along the fiber transducer length for access at ends of the fiber transducer. In one embodiment, each charge collector domain includes at least one electrical conductor embedded within the cross-sectional extent of the charge collector domain along the length of the fiber transducer. In one embodiment, each charge collector domain includes two electrical conductors embedded within the cross-sectional extent of the charge collector domain along the length of the fiber transducer, as shown in FIG. 3. Each electrical conductor 32 is fully embedded in a charge collector domain, in the cross-section, or is at least partially embedded in a charge collector domain, in the cross-section.

Each electrical conductor possesses sufficient electrical conductivity to operatively provide electrical conductivity along the entire longitudinal length of the fiber transducer and to provide a uniform electrical field along the entire longitudinal length of the fiber transducer. A conductive material is herein given as a material that has a bulk resistivity of about 10-5 ohm m or less at a temperature of about 20° C. In embodiments herein, wires are provided as the electrical conductors; in preferred embodiments, one of copper wires, tungsten wires, or other suitable wire materials, are employed, having a wire diameter of between about ten microns and about 200 microns. Each wire is in one embodiment coated with silver, gold or other desired material.

As shown in FIG. 3, the at least one piezoelectric domain 25, the charge collector domains 30, and the electrical conductors 32, are sited inwardly of an acoustic pressure collection domain 35 that is disposed outwardly of those domains. The acoustic pressure collection domain 35 includes or is substantially entirely formed of one or more acoustic energy transmission materials. The acoustic pressure collection domain 35 of acoustic energy transmission material is the outer-most region of the fiber transducer and is an exterior encapsulation of the at least one piezoelectric domain, the charge collector domains, and the electrical conductors. In preferred embodiments, the outer-most, i.e., external, surface 36 of the fiber transducer is the acoustic energy transmission material of the acoustic pressure collection domain 35. None of the piezoelectric domain, the charge collector domains, or the electrical conductors protrude from the surface of the acoustic pressure collection domain 35.

The acoustic pressure collection domain 35 is the interface between the piezoelectric domain 25 of the fiber transducer and the exterior environment of the fiber transducer. None of the piezoelectric domain, the charge collector domains, or the electrical conductors are exposed at the outer-most surface 36 of the fiber transducer at any point along the fiber transducer length, except at selected sites for electrically accessing the electrical charge transported by the wires. Preferably the only electrical access sites are at ends of the fiber transducer. In embodiments herein, the acoustic pressure collection domain 35 has a thickness of between about 5 microns and about 200 microns.

The acoustic energy transmission material included in the acoustic pressure collection domain 35 of the fiber transducer is operative to collect audible acoustic energy in the environment of the fiber transducer and concentrate the audible acoustic energy at the piezoelectric domain within the fiber transducer, so that the sensitivity of the piezoelectric domain is sufficient to sense audible sounds. It is discovered herein that to have sufficient sensitivity whereby audible sounds can be sensed by the piezoelectric domain of the fiber transducer, an acoustic energy transmission material is required as an interface between the piezoelectric domain of the fiber transducer and the exterior environment of the fiber transducer. In some embodiments herein, the acoustic energy transmission material has an acoustic impedance that substantially matches the acoustic impedance of air, that is, the speed of sound in air and in the acoustic energy transmission material is substantially the same. As a result, acoustic energy travelling through the air in the vicinity of the fiber transducer is absorbed into the acoustic energy transmission material. The acoustic energy transmission material develops a mechanical vibration in response to an incoming audible acoustic wave and translates as well as concentrates the corresponding vibrational energy to the inwardly-disposed piezoelectric domain, which is discovered to react in a corresponding cross-sectional bending mode.

In some embodiments, the acoustic energy transmission material is of sufficiently low Young's modulus, E, and sufficiently lower Young's modulus than that of the piezoelectric domain, that this behavior is achieved with very high sensitivity, thereby to enable sensing of audible sounds having a level of sound intensity, or sound vibration amplitude, that is less than 100 dB. In the description herein, the term 'modulus' is used herein interchangeably with the term 'Young's modulus.' In embodiments herein the acoustic energy transmission material of the fiber transducer also exhibits excellent rheological properties, including a minimum viscosity of 1000 Pa·s to maintain the mechanical integrity of the fiber transducer.

In embodiments provided herein, the acoustic energy transmission material is a material having a Young's modulus, E, of at least about 0.2 MPa. In other embodiments, the acoustic energy transmission material has a Young's modulus of at least about 0.3 MPa. In other embodiments, the acoustic energy transmission material has a Young's modulus of no more than about 500 MPa, or has a Young's modulus of no more than about 400 MPa. In other embodiments, the acoustic energy transmission material has a Young's modulus that is at least about 0.3 MPa and no more than about 500 MPa.

In one embodiment, the acoustic pressure collection domain and the acoustic energy transmission material are in general much less mechanically rigid than the piezoelectric domain. In some embodiments, the acoustic energy transmission material is much less mechanically rigid than a Young's modulus value that reflects the aggregate structure of the piezoelectric polymer matrix, the piezoelectric particles, the charge collector domains, and the electrical conductors. In preferred embodiments, the piezocomposite of the piezoelectric domain and in general the combined structure of the piezoelectric matrix, piezoelectric particles, charge collector domains, and electrical conductors, is much more rigid than the acoustic energy transmission material; resulting in a large contrast in Young's modulus between the two.

It is discovered herein that an acoustic pressure collection domain that is less mechanically rigid than the inwardly-disposed piezoelectric domain and associated structures causes mechanical stress concentration in the active piezoelectric domain, thereby enhancing the response of the piezoelectric domain to external sound pressure. In other words, the piezoelectric domain is preferably stiffer than the outwardly-disposed acoustic pressure collection domain. If the outer acoustic pressure collection domain were stiffer than the inwardly-disposed piezoelectric domain, very little stress and corresponding response is developed in the piezoelectric domain. The higher the stress at the interface of the acoustic energy transmission material and the piezoelectric domain aggregate structure, including charge collectors and electrical conductors, the larger the response of the piezoelectric domain to incoming acoustic energy that is directed to the piezoelectric domain from the acoustic energy transmission material.

It is further discovered that a mechanically flexible outer acoustic pressure collection domain enables the fiber transducer to conformally match vibration modes of textile fibers with which the fiber transducer is arranged as an acoustic material. Further, mechanical flexibility of the outer acoustic pressure collection domain facilitates machine weaving of the fiber transducer into an acoustic fabric. In addition, mechanical compliance of the fiber transducer renders the fiber transducer a bendable, twistable fiber that maintains functionality during operational conditions as a human garment as well as conventional fabric environments such as machine washing.

The lower limit of sensitivity of a commercial microphone is about 1 mV at 94 dB and 1000 Hz. Considering the ratio of the piezoelectric domain modulus to the acoustic energy transmission material modulus of the fiber transducer herein for this sensitivity, in embodiments herein the ratio of the piezoelectric domain modulus, $E_{piezo}$, to the acoustic energy transmission material modulus, $E_{trans}$, $E_{piezo}/E_{trans}$, is between about 5 and about 70,000. This ratio can be confirmed by, e.g., a 2-D model that considers the axial fiber cross-section and one plane of a membrane, such as a Mylar membrane, to simulate the output voltage of the fiber transducer when included in an acoustic fabric, using a finite element simulation software based on COMSOL Multiphysics. Such model couples the acoustics module, solid mechanics module and electrostatics module. The fiber output voltage at each ratio of $E_{piezo}/E_{trans}$ is obtained via tuning the Young's modulus of the acoustic energy transmission material while fixing the Young's modulus of piezoelectric domain at 2.3 GPa. The sound pressure level is here given as 94 dB and the frequency of sound is given as 1000 Hz. Under this setting, the voltage output defines the sensitivity of the fiber transducer acoustic sensing capability, and for these conditions, the ratio is defined. In embodiments herein, the ratio of piezoelectric domain modulus to acoustic energy transmission material modulus, $E_{piezo}/E_{trans}$, is between about one and about 10,000; in other embodiments, the ratio $E_{piezo}/E_{trans}$, is between about ten and about 2,000; in one embodiment, the ratio $E_{piezo}/E_{trans}$, is about 1,000.

Under these conditions, the acoustic energy transmission material is operative to collect and concentrate acoustic energy at the piezoelectric domain within the fiber transducer to a level that is sufficient to achieve sufficient sensitivity for producing a transduction signal to audible sounds having a decibel sound amplitude that is below 100 dB. In embodiments herein, the ratio of piezo domain modulus to acoustic energy transmission material, $E_{piezo}/E_{trans}$, is a value that produces and requires a fiber transducer output signal sensitivity of at least about 1 mV at an audible sound level of no more than about 100 dB. This results in a maximization of piezoelectric response by the fiber transducer, and achieves audible acoustic sensing by the fiber transducer to a degree that was previously not attainable in such a form factor.

Simulations confirm this paradigm. An acoustic energy transmission material that is soft relative to the piezoelectric domain of the fiber transducer, resulting in a modulus ratio of between about 5 and about 70,000, causes stress from acoustic energy to be highly concentrated in the piezocomposite, and the sensitivity of acoustic sensing by the fiber transducer is maximized. On the other hand, when a relatively rigid acoustic energy transmission material such as polycarbonate (PC) is employed, the stress generated by input acoustic energy is concentrated on the surface of the PC acoustic energy transmission material rather than in the piezoelectric domain. In this case, the acoustic fiber response is quite limited and cannot sense audible sound below about 60 dB. It is therefore preferred that the ratio of the piezoelectric domain modulus, $E_{piezo}$, to the acoustic energy transmission material modulus, $E_{trans}$, $E_{piezo}/E_{trans}$, be between about one and about 10,000.

In embodiments herein, the acoustic energy transmission material of the acoustic collection domain is poly(styrene-b-(ethylene-co-butylene)-b-styrene) (SEBS); or is a two-phase block copolymer of a polydimethylsiloxane phase and an aliphatic isocyanate phase, such as a Geniomer® thermoplastic silicone elastomer; or is a cyclic olefin copolymer elastomer; or is a semicrystalline cyclic olefin copolymer elastomer such as TOPAS® Elastomer E-140; or other suitable material.

In embodiments herein, conventional so-called polymer fiber cladding materials, that are generally employed as polymer fiber cladding, are prohibited as an acoustic energy transmission material and are not included in the fiber transducer. The modulus of the acoustic energy transmission material is in preferred embodiments between about 0.3 Pa and about 500 MPa, or is between about 0.5 Pa and about 400 MPa, or is between about 0.25 Pa and about MPa. In other embodiments, the modulus of the acoustic energy transmission material is less than about 500 MPa, or in further embodiments, the modulus of the acoustic energy transmission material is less than about 400 MPa; in other embodiments, the modulus of the acoustic energy transmission material is less than about 750 MPa.

In stark contrast, the modulus of polyimide materials is between about 2.5 GPa to 7.5 GPa; the modulus of polysulfone materials is about 5.2 GPa; the modulus of polycarbonate materials is between about 2.0 GPa to 2.6 GPa; the modulus of polyethylene is about 1 GPa; the modulus of polystyrene is about 3.2 GPa; the modulus of polymethacrylate materials is about 2.85 GPa; the modulus of polyester materials is between about 1.0 GPa to 10.6 GPa; the modulus of polyacrylate materials is about 3.2 GPa; the modulus of polyether sulfone materials is between about 2.4 to 7 GPa; the modulus of polyether ketone is about 3.6 GPa; the modulus of cyclic olefin materials is between about 2.6 GPa to 3.2 GPa; the modulus of fluorinated polymer materials is in the range of GPa, as the modulus of polytetrafluoroethylene is about 0.5 GPa.

As a result, in embodiments herein, the materials polyimide, polyetherimide, polysulfone, polycarbonate, polyethylene, polystyrene, polyether ketone, polymethacrylate, polyester, polyacrylate, polyether sulfone, cyclic olefins, and fluorinated polymers, including polytetrafluoroethylene, are all excluded from the acoustic pressure collection domain and the acoustic energy transmission material of the fiber transducer.

Turning back to FIG. 3, the cross-sectional geometry of the fiber transducer is in some embodiments generally rectangular, square, or otherwise non-circular. In some embodiments, the acoustic fiber is not cylindrical. In other embodiments, the exterior cross section of the acoustic energy transmission material is circular while the piezo-domain encapsulated within the acoustic energy transmission material is non-circular.

In some embodiments, the piezoelectric domain and the charge collector domains are generally rectangular domains sited within the fiber transducer cross section. It can be preferred in some embodiments to not employ generally cylindrical, half-cylindrical, elliptical, and concentric arrangements of the piezoelectric domain and the charge collector domains. In other words, no cylindrical or concentric arrangements are included. In such a configuration, the electrical charges generated in the piezoelectric domain would be opposite at sites opposite each other across a cylindrical domain, resulting in a net cancellation of electrical charge in the charge collection domains and elimination of acoustic sensing by the fiber. Such a configuration is herein discovered to be inoperable for audible acoustic sensing, and is excluded in the fiber transducer.

It is discovered herein that the acoustic sensing performance of the acoustic fiber increases with increasing aspect ratio of the fiber transducer cross section. In other words, an increase in the ratio of the fiber transducer width to fiber transducer height increases the acoustic sensing performance of the fiber transducer. This effect is more significant at smaller aspect ratios. For example, the average electrical output voltage signal produced by the piezoelectric domain increases by one order of magnitude when the fiber transducer aspect ratio is increased from 0.8 to 1.8. The average electrical output voltage signal produced by the piezoelectric domain increases by a factor of less than 2 when the fiber transducer aspect ratio is increased from 1.8 to 3.6.

The piezoelectric domain and adjacent charge collector domains are in some embodiments together sited within the acoustic energy transmission material at an asymmetrical position in the cross-section of the fiber transducer orthogonal to the longitudinal cross section. In particular embodiments, the piezoelectric domain and adjacent charge collector domains are together sited in the cross section at a position that is not the neutral axis of strain in the fiber transducer cross section. For example, if the neutral strain axis is at the center of the fiber transducer cross section, then the piezoelectric domain and adjacent charge collector domains are preferably sited away from the center of the fiber transducer cross section.

The strain developed in the piezoelectric domain is proportional to the distance from the neutral strain axis to the piezoelectric domain siting. A higher strain leads to a higher stress in the piezoelectric domain and a correspondingly higher electrical charge generation and voltage response to audible acoustic stimuli. It is therefore preferred that the piezoelectric domain be sited off-neutral-axis in the cross-section of the fiber transducer. In embodiments herein, the piezoelectric domain is sited between about ten microns and about 500 microns off of the neutral axis in the cross-section of the fiber transducer. In addition, as the ratio of the fiber width to fiber height increases, the sensing performance of the acoustic fiber increases.

Figure 4:
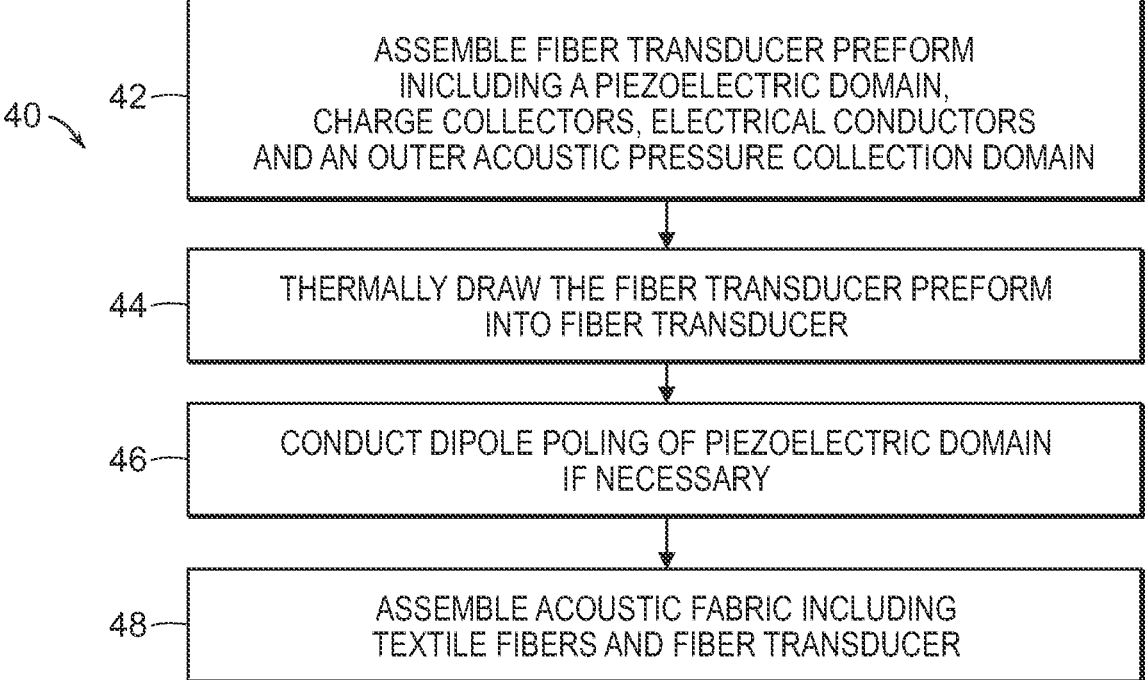
FIG. 4 is a flow chart of a method embodiment provided herein for producing the fiber transducer of FIG. 1 and FIG. 2A.

Turning to methods for producing the fiber transducer, the steps of a non-limiting example fiber transduction and acoustic fabric assembly process are shown in FIG. 4. In general, in a first step 42, a fiber transducer preform is assembled with materials and elements corresponding to a piezoelectric domain, charge collector domains, electrical conductors, and an outer acoustic pressure collection domain. Then in a subsequent step 44, the fiber transducer preform is thermally drawn into the fiber transducer. After the thermal draw, a step 46 of dipole poling of the piezoelectric domain can be conducted if necessary. With this step, the fiber transducer is complete. In a final step, an acoustic fabric is assembled including textile fibers and the fiber transducer.

Figure 5:
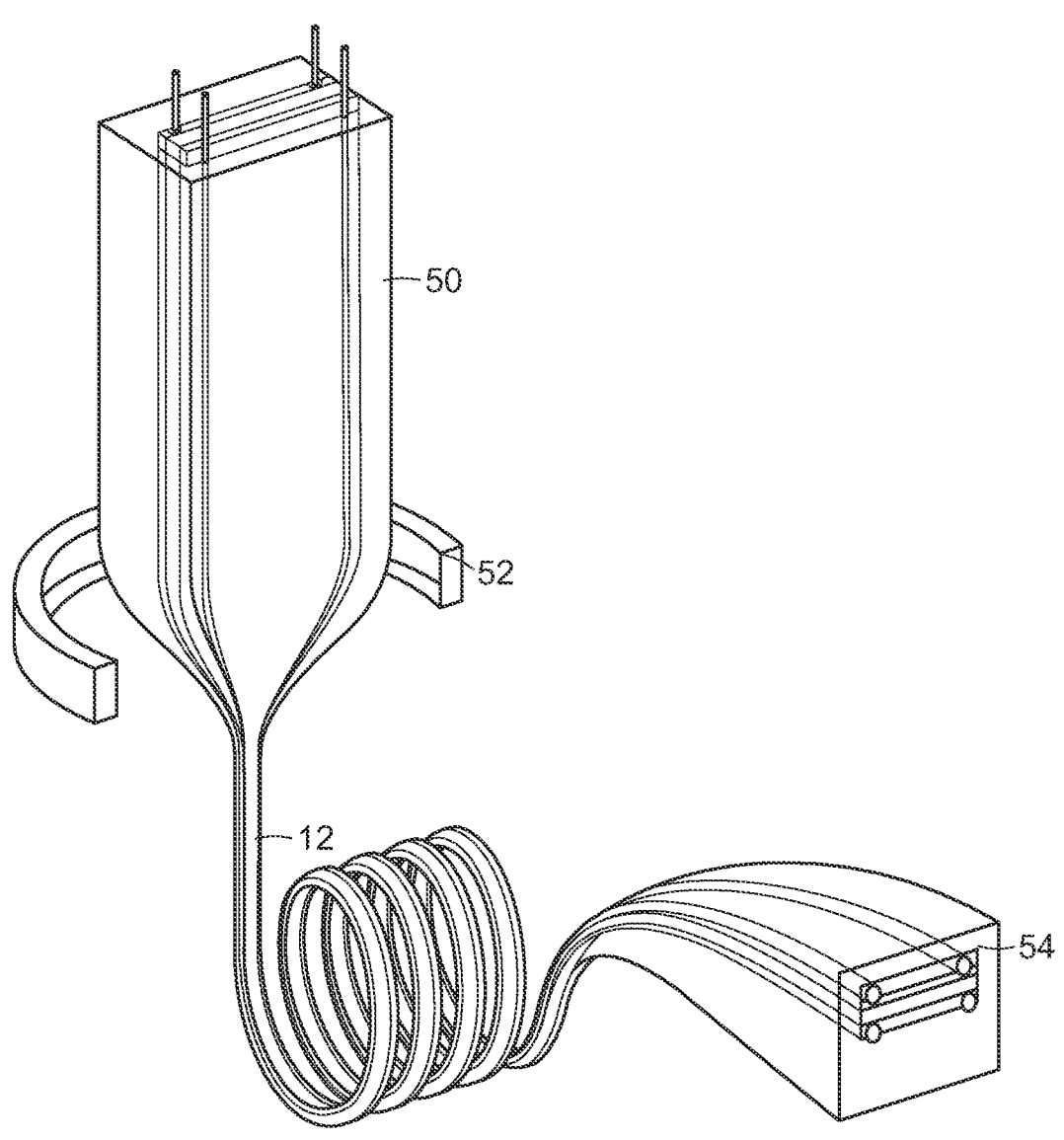
FIG. 5 is a schematic view of the thermal drawing of the fiber transducer of FIG. 1 and FIG. 2A.

As shown schematically in FIG. 5, the steps of this method produce a fiber transducer preform 50 that is heated under thermal drawing conditions by the heating zone 52 of a thermal draw tower to produce a fiber transducer 12. The fiber transducer 12 as-drawn includes a cross section 54 like that shown in FIG. 3, including a piezoelectric domain, charge collection domains, electrical conductors, and an outer acoustic pressure collection domain.

Figure 6:
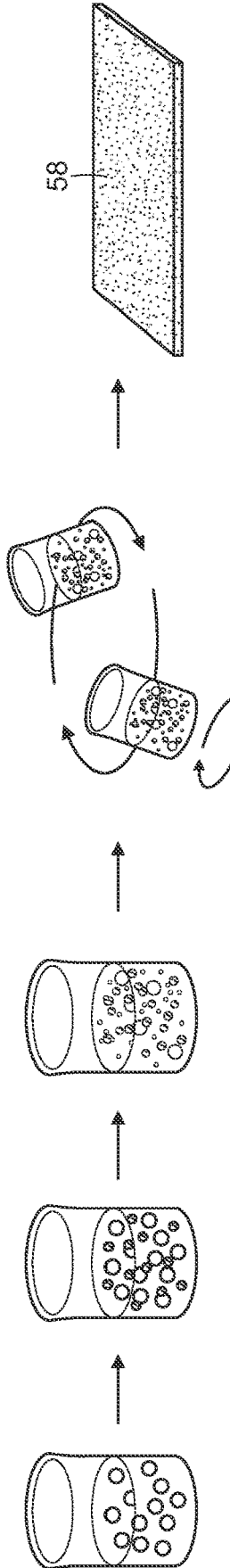
FIG. 6 is a schematic view of the materials being processed to produce the fiber transducer internal piezoelectric domain of FIG. 3.

Considering now example embodiments of this method, the fiber transducer preform is assembled of elements that are arranged for producing the fiber transducer configuration by way of thermal drawing. In one embodiment, as shown in FIG. 6, a nanostructured piezocomposite thin film 58 is prepared for assembly in the preform, the thin film including a selected piezoelectric, non-centrosymmetric polymer and piezoelectric particles. In production of the film, the piezoelectric, non-centrosymmetric polymer is dissolved in a selected solvent, and then the piezoelectric nanoparticles are added and continuously stirred for a selected duration, then sonicated to form a suspension.

It is preferable that the particles be homogeneously distributed in the polymer matrix because any aggregation of particles would constitute a localized region of relatively high viscosity that could deteriorate acoustic energy conversion during fiber operation, as well as cause fiber breakage during the thermal draw step. This requirement is met by well-controlled centrifugal mixing for uniform dispersal of the particles in the liquid polymer. The liquid is then poured on a substrate such as a glass plate for formation of a piezo-composite film 58. After drying of the film as necessary, the film is in one embodiment hot-pressed into a sheet having a selected thickness and cut to dimensions for arrangement in a preform assembly.

Two charge collector films are then formed in a similar manner with selected materials. The piezocomposite film 58 is sandwiched between the two charge collector films. Each charge collector layer is cut to form gaps in the layer at each of two sites for positioning the electrical conductors. A layer of acoustic pressure collection material is wrapped around the sandwich, forming a generally rectangular preform having dimensions of about 2.5 cm×1.38 cm×18 cm.

In one non-limiting embodiment, the piezo-composite film 58 is formed of a dispersion of $BaTiO_3$ particles dispersed in a P(VDF-TrFE) polymer matrix win a particle to polymer matrix ratio of 1%-6% volume fraction and the two charge collector films are formed of carbon-loaded polyethylene (CPE) nanocomposite films having a carbon loading fraction of about 5%. CPE is particularly preferred as a charge collector material because it exhibits both sufficient electrical conductivity and a relatively high viscosity at a thermal draw temperature. In one embodiment, each charge collector domain extends substantially across the entire extent of the piezoelectric domain. This enables collection of charge carriers along the entire piezoelectric domain in the fiber transducer cross-section.

This arrangement also outwardly confines the relatively lower-viscosity piezocomposite with the CPE charge collector domains to prevent the capillary breakup of the piezocomposite during the thermal draw step. Specifically, in embodiments herein, each charge collector domain is operative to laterally confine the piezoelectric composite between the charge collector domains, in the cross-sectional plane of the fiber transducer, orthogonal to the fiber length, to prevent capillary breakup of the piezoelectric composite during thermal drawing. This can be achieved by a charge collector domain material having a viscosity that is higher than that of the piezoelectric composite. For example, in embodiments herein, each charge collector domain exhibits a minimum viscosity of about $10^4$ Pa·s at a thermal draw temperature that is common to the charge collector domains and the piezocomposite. The viscosity of the piezoelectric domain is preferably at least about $10^4$ Pa·s less than the viscosity of the charge collector domains at a common thermal draw temperature.

Continuing with the example embodiment, two CPE charge collector layers are arranged on opposite sides of the piezoelectric composite film and then copper wires of about 50 μm in diameter are prepared for feed into the fiber transducer during the thermal draw. In one preferred embodiment, the wires are fed into the fiber preform during the draw using a convergence technique in the manner taught in U.S. Pat. No. 10,509,186, issued Dec. 17, 2019, the entirety of which is hereby incorporated by reference.

In this example embodiment, the assembly is encapsulated within a poly(styrene-b-(ethylene-co-butylene)-b-styrene) (SEBS) acoustic energy transmission material layer having a thickness of about 2 mm. The composite preform is then consolidated, if necessary, at an elevated temperature and if desired, under mechanical pressure, to form intimate internal material interfaces. The preform is subsequently drawn in a suitable fiber draw tower, including a three-zone vertical tube furnace, at a temperature above the glass transition temperature of the acoustic energy transmission material; for SEBS, the glass transition temperature is about −55° C., and above the melting point of the piezoelectric polymer, here P(VDF-TrFE), having a melting point of 150° C.

In one example embodiment, a top-zone temperature of about 120° C., a middle zone temperature of about 252° C., and a bottom-zone temperature of about 80° C. are employed. In other embodiments herein, the draw tower middle zone temperature is controlled to produce a temperature of the neck-down region of the preform that is between about 140° C. and about 175° C., as-measured by, e.g., a thermocouple. The applied draw tension is in one embodiment between about 50 g and about 100 g. The draw-down ratio is in one embodiment between about 5 and about 40.

In the convergence technique for incorporating wires into the fiber transducer as the fiber transducer is thermally drawn, there is tension applied on the wires as the wires are fed into the fiber transducer preform from spools. It is discovered herein that this tension exerts compressive stress on the piezocomposite domain in the neck-down region of the preform, at which point the piezocomposite domain is molten. This compressive stress is herein exploited to prevent capillary breakup of the piezocomposite domain during the thermal draw. As a result, in embodiments herein it can be preferred to include four wires in the fiber transducer, two wires in each charge collector domain as shown in FIG. 3. In other embodiments herein, one wire is included in each charge collector. But for many applications, it can be preferred to include two wires in each charge collector domain.

During the thermal draw, the piezoelectric particles, in this example $BaTiO_3$ particles, undergo a shear-assisted smooth flow along with the polymer chains of the polymer matrix, in this example, P(VDF-TrFE), despite the rigidity of the particles. This ensures the uniformity of the piezoelectric domain functionality along the fiber transducer length. The drawn fiber is bendable and twistable and maintains its electrical properties even after many machine-wash cycles, demonstrating superior mechanical compliance even with the population of rigid piezoelectric particles in the piezoelectric domain.

Further, in this example employing SEBS as an acoustic energy transmission material, the high viscosity of SEBS relative to the inwardly-sited domains prevents reflow of the interior domains and preserves the geometric arrangement of the fiber transducer's cross section through the thermal draw. As a result, as shown in FIG. 5, the fiber transducer cross-section is a scaled-down version of that of the initial fiber transducer preform, and intimate interfaces between the piezoelectric domain and the charge collector domains are formed during the thermal draw.

After the thermal draw step, in some embodiments herein there is conducted a step-wise poling method to align the dipoles in the piezocomposite, if such are not aligned inherently at the completion of the thermal draw process. In one poling method embodiment, a voltage is repeatedly applied across the piezoelectric domain of the fiber transducer, e.g., by electrical connection of a voltage source between two of the electrical conductors on opposites sides of the piezoelectric domain. In a first poling step, the applied voltage is set at a first voltage amplitude, e.g., about 100 V, for a first time duration, e.g., 4 mins, and then removed for a second time duration, e.g., 3 mins. After the first poling step, the applied voltage is set at a second voltage higher than the first voltage, e.g., 200 V, for the first time duration, e.g., 4 mins, and then removed for the second time duration, e.g., 3 mins. This stepped poling sequence is repeated until a maximum selected voltage, e.g., 3300 V, is applied, here for a fiber transducer including a 30 micron-thick piezoelectric domain.

The alternating, ever-increasing voltage and short circuit not only eliminate any dielectric breakdown during the poling process but also endow the piezoelectric domain with excellent piezoelectric properties, such as a super-high polarization and a large piezoelectric voltage coefficient. The very high piezoelectric coefficients that are exhibited by the fiber transducer after thermal drawing are even further enhanced. In particular, in embodiments herein, the piezoelectric domain is characterized by a piezoelectric coefficient $d_{33}$ of at least about 50 pC/N and an effective piezoelectric coefficient dm' of at least about 40 pC/N. In embodiments herein, the β-phase weight fraction of fiber transducer piezoelectric domain is greater than about 60%, after poling. In other words, in embodiments herein, the fiber transducer includes a piezoelectric domain having a β-phase weight fraction greater than about 60%.

With the completion of poling of the piezoelectric domain, if necessary, the fiber transducer production method is then accomplished. The fiber transducer is then, in one embodiment, configured in a selected application as a stand-alone acoustic fiber transducer. In one embodiment, the acoustic fiber transducer is configured in an output circuit for collection and if desired, processing, of output signals produced by the fiber transducer in response to acoustic input. In embodiments herein, external connection is made to the fiber transducer by localized removal of the outer acoustic energy transmission material layer and where necessary, regions of the charge collectors, to electrically connect external wires to the internal wires of the fiber transducer. The fiber transducer is connected in any suitable manner to a microprocessor, microcontroller, processing unit, controller, oscilloscope, memory storage, output display, and other selected componentry for processing, display, control, and storage of the output signal of the fiber transducer. In one embodiment, there is included a processor or circuit component for filtering out noise of a frequency higher than about 20 KHz, and in a further embodiment, there is included a processor or circuit component for amplifying the output signal with a gain of between about 5 and about 200.

In operation of the fiber transducer, in the absence of acoustic energy input to the fiber transducer, the dipoles in the piezoelectric domain of the fiber transducer are electrically neutral. When audible sound energy is transmitted from the environment through the acoustic energy transmission material to the piezocomposite domain within the fiber transducer, the impact of the mechanical force at the piezocomposite domain disrupts this electrically neutral equilibrium and generates electrical charge. This shift from equilibrium thereby produces electrical surface charge on each of the charge collector domains. As a result, an electric field is formed between the two charge collectors, and correspondingly results in production of an electrical voltage between the charge collectors. In turn, the internal wires or other electrical conductors in contact with the charge collectors deliver the voltage signal to the output of the fiber transducer. An output circuit, computer, or other processing componentry to which the fiber transducer is electrically connected captures this output voltage.

Turning to other embodiments herein, with this operation of the fiber transducer, the fiber transducer is arranged with textile fibers in the formation of an acoustic fabric provided herein. In the acoustic fabric configuration provided herein, at least one fiber transducer is integrated with a matrix of textile fibers in an arrangement of the acoustic fabric. As explained in detail below, the fiber transducer is arranged by coupling to the matrix of textile fibers, and/or by weaving in with the textile fiber matrix, or both. The impact of sound energy at yarns, threads, and other textile fibers, and/or other elements of the acoustic fabric textile matrix causes mechanical vibration of the fabric textile matrix, which is translated to the fiber transducer and generates electrical charge in the fiber transducer. This is in addition to the electrical charge generated by the fiber transducer due to sound impact at the fiber transducer itself.

To better understand the interaction between input sound energy and a fiber transducer incorporated into acoustic fabric, there was modeled and experimentally operated the fiber transducer disposed on a membrane. Finite element simulation with a 3-D electromechanical-acoustical model (COMSOL Multiphysics) enables modeling and analysis of this system.

An experimental fiber transducer was also manipulated and tested to understand the interaction between the fiber transducer and a textile fabric matrix. Referring to the embodiment of FIG. 3, a fiber transducer including an acoustic pressure collection domain 35 of SEBS, a piezoelectric domain 25 of P(VDF-TrFE)-BaTiO$_3$, with 30 mol % TrFE and 25 wt % BaTiO$_3$ particles, CPE charge collectors 30 with about 5% volume carbon loading and 50 micron-diameter copper wires 32.

Figure 7:
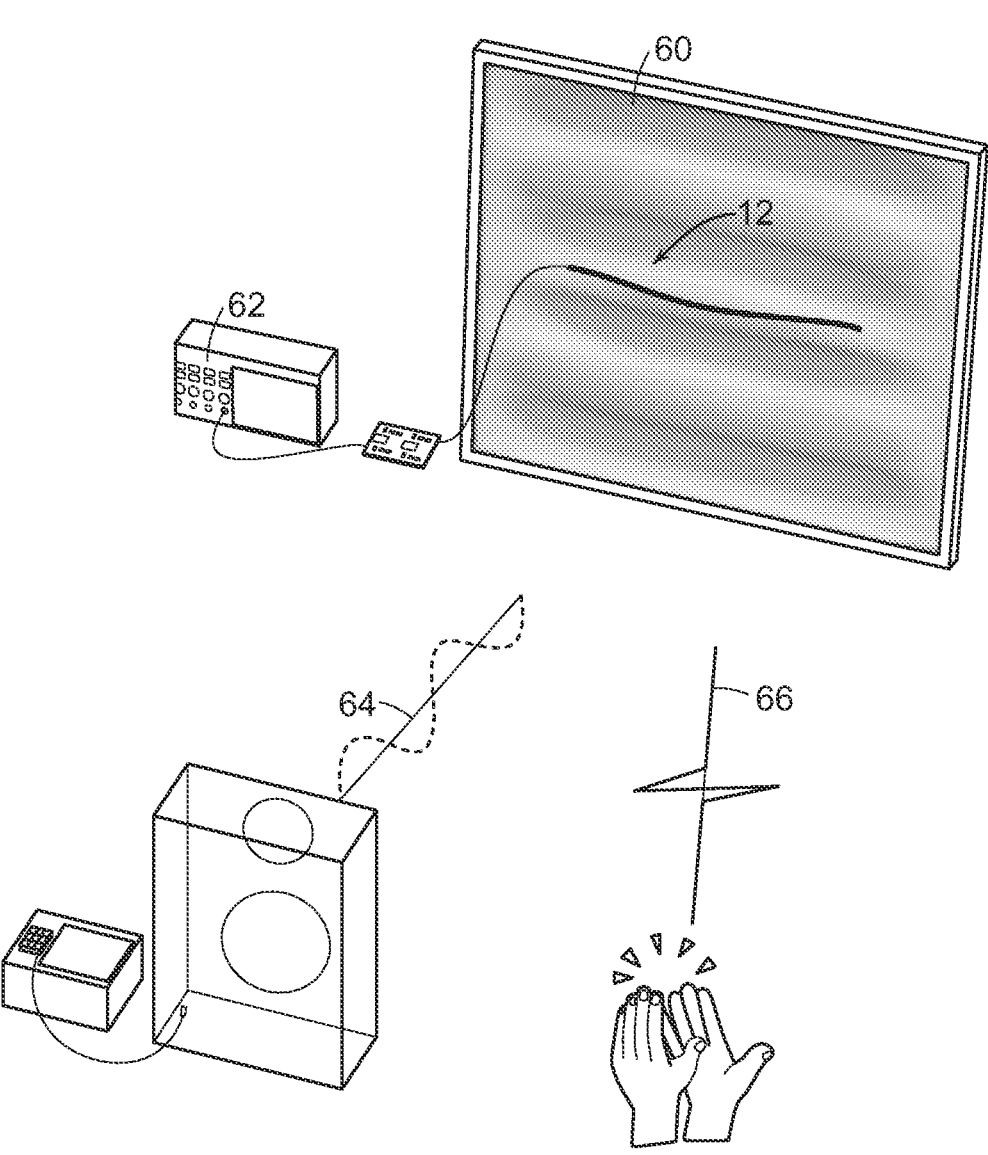
FIG. 7 is a schematic view of an experimental setup employed for testing the performance of the fiber transducer and acoustic fabric of FIG. 1.

Referring to FIG. 7, the fiber transducer's performance on a membrane was experimentally characterized by fixing the fiber transducer 12 on a Mylar membrane 60 attached to a metal frame. The Mylar membrane, of 25 microns in thickness, was fastened in an 8 cm×8 cm square aluminum frame clamped in the upright position. Light tension was applied to the membrane to smooth out wrinkles. A 6.5 cm-long fiber transducer was placed on the membrane and attached at each end using double-sided tape. The full length of the fiber transducer was in contact with the membrane because the SEBs surface is somewhat sticky.

The fiber transducer's performance as a stand-alone transducer, without membrane, was also characterized experimentally by fixing ends of a fiber transducer of 6.5 cm in length across the opening of a 6.5 cm metal frame. In both cases, the fiber transducer was connected by wires to an oscilloscope 62 to collect, display, and record the electrical output signal from the fiber transducer. The sound input directed to the fiber transducer included continuous sound waves 64 produced by a speaker or an acoustic impulse 66 from a clap, both at a distance of approximately 2 meters away from the Mylar membrane.

Figure 8:
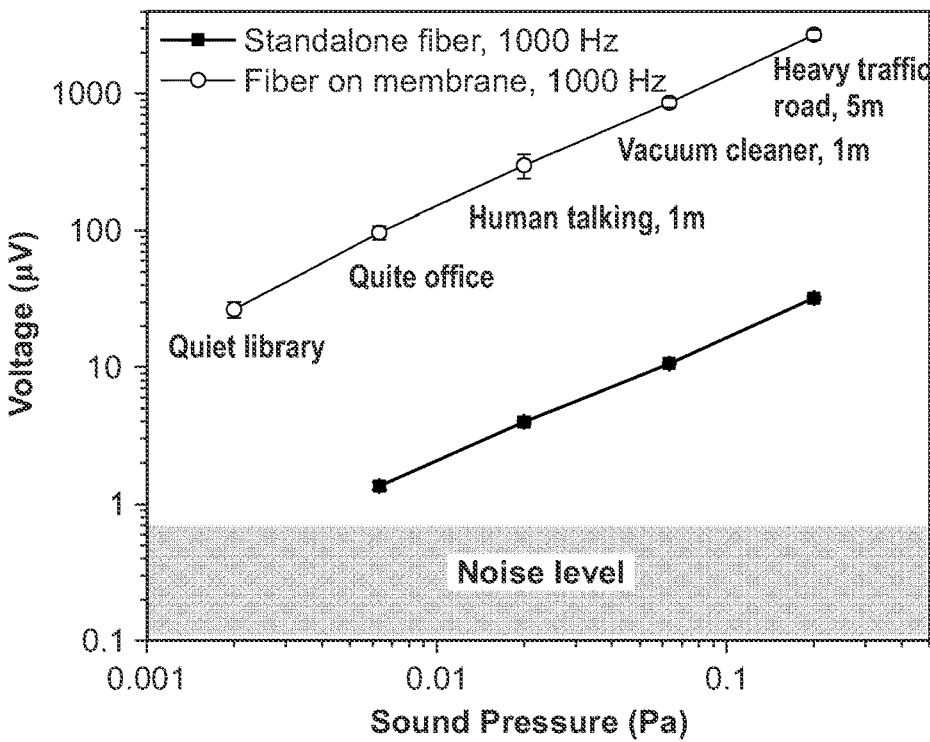
FIG. 8 is a plot of the output voltage as a function of input sound pressure the fiber transducer of FIG. 2 as a stand-alone transducer and is a plot of the output voltage as a function of input sound pressure of the fiber transducer of FIG. 2 as-disposed on a Mylar membrane.

FIG. 8 is a plot of the measured output voltage produced by the fiber transducer as a function of applied sound pressure from the application of continuous sound waves, both as a stand-alone fiber transducer and as-arranged with the membrane, at a 1000 Hz acoustic frequency. The noise level of the output signal is also shown in the plot. As shown in the plot, the electrical output of the fiber transducer-membrane combination is two orders of magnitude higher than that of the stand-alone fiber. It is discovered herein that the sound pressure difference on the front and back side of the membrane causes mechanical vibration modes in the membrane which are strongly coupled to the fiber transducer, resulting in the unexpectedly superior performance over that of a stand-alone fiber transducer.

As seen in the plot of FIG. 8, the output voltage of both the stand-alone fiber transducer and the fiber transducer-membrane combination increases linearly with increasing sound pressure level, consistent with the acoustic response characteristic of linear materials. The minimum sound-detection capability of the transducer-membrane combination reaches about 0.002 Pa, or 40 dB, the sound pressure level characteristic of a quiet library, outperforming many commercial thin-film-based acoustic sensors.

Figure 9:
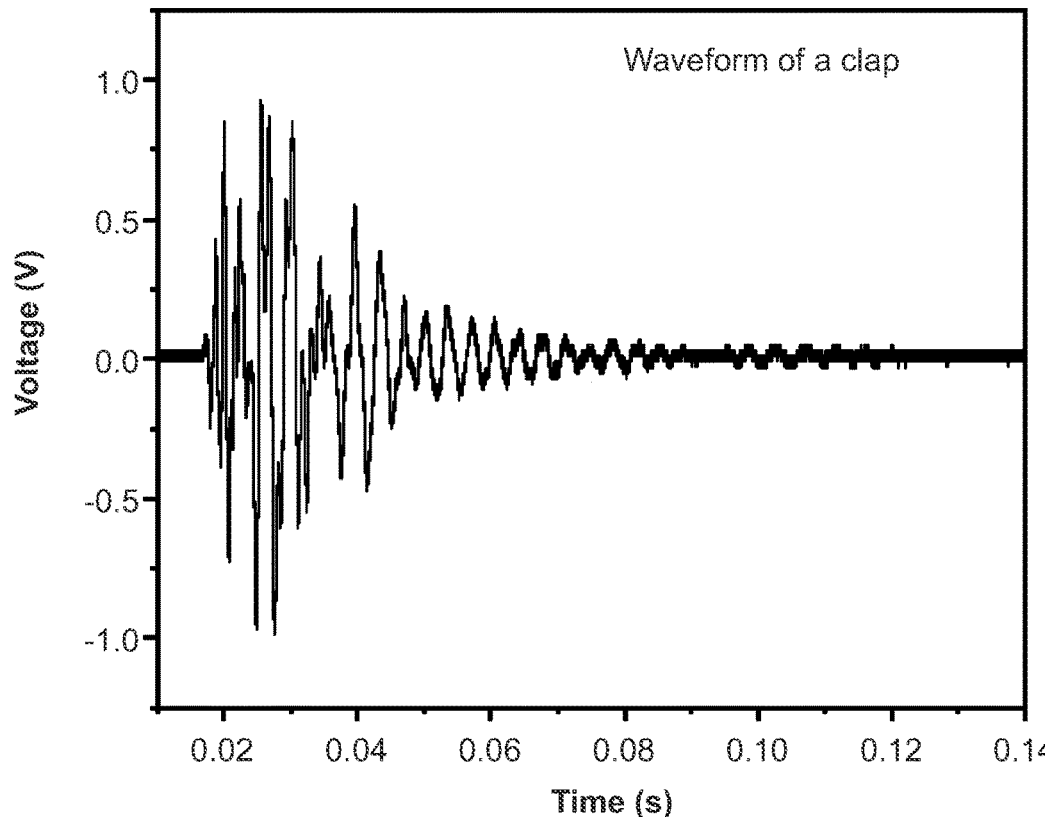
FIG. 9 is a plot of the output voltage as a function of time for an input sound of a clap for the fiber transducer of FIG. 2 as-disposed on a Mylar membrane.

FIG. 9 is a plot of the output voltage produced by the fiber transducer as-configured with the Mylar membrane in response to an audible clap; the output voltage was amplified 68× for plotting purposes. The high-fidelity with which the system efficiently recorded the short impulse of a clap is discovered to be due to the relatively high Young's modulus of the Mylar membrane of about 12.67 GPa. The high Young's modulus-membrane experiences minimal losses, enabling efficient transfer of energy to the fiber transducer and corresponding generation of an output voltage. The fiber transducer-membrane system demonstrated a sensitivity of 13.5 mV at 94 dB and 1 kHz, using standards in the field. This is comparable to commercial condenser and dynamic microphones. This high sensitivity results in a high signal-to-noise ratio, of about 50, for a wide range of sound sources, including human speech, air blowing, leaves, rustling, and birds chirping.

To reveal the transduction mechanism between a membrane and the fiber transducer, a 3-D acoustical-mechano-electro model (COMSOL Multiphysics) simulates this system with an acoustic pressure field as an input and an electrical signal originating from the fiber transducer, as configured with a Mylar membrane of about 12.67 GPa, as an output. From the simulation results, it is discovered that the dominant factor in determining the electrical output is the axial bending modes of the fiber transducer, which occur when the fiber transducer is conformally displaced by the membrane vibration modes induced by the incoming pressure wave. FIG. 10A is a plot of simulated displacement contour of the fiber transducer and membrane at a resonance peak at 300 Hz and FIG. 10B is a plot of the same at an anti-resonance peak at 440 Hz; FIG. 10C plots the output voltage as a function of input sound frequency for both the experimental system and the system model.

As shown in the plots, the peak-to-peak displacement of the fiber transducer on the membrane at an input at 300 Hz is over one order of magnitude larger than that at an input at 440 Hz. A larger displacement results in a higher curvature and thus more strain in the piezocomposite domain of the fiber transducer, based on Euler-Bernoulli beam theory. The longitudinal bending contour of the fiber transducer is determined by conformal matching with the underlying membrane modes. This influences the curvature and displacement of the fiber transducer and thus the output voltage that is produced thereby. At 300 Hz, the fiber transducer, following the lower order bending modes of the membrane, is curved in the same direction along its entire length, as shown in the 300 Hz plot in FIG. 10A. Contrastingly, as shown in the 440 Hz plot in FIG. 10B, the membrane modes are of higher order, and thus, the curvature of the fiber transducer switches signs along the fiber length at 440 Hz.

This insight led to a discovery herein that when the fiber transducer is curved in the same direction down the entire length of the transducer, electrical charges of the same type, i.e., either positive charges or negative charges, build up on the same charge collector sited adjacent to the piezoelectric domain of the fiber transducer. This charge buildup on one charge collector leads to a high output voltage. When the fiber transducer curvature changes direction at one or more sites along the length of the transducer, then electrical charges of the same type build up on both of the two opposing charge collectors. This results in electrical charge cancellation between the two charge collectors and produces a lower output voltage.

This discovery is confirmed by the measured and simulated data in the plot of output voltage as a function of input sound frequency shown in FIG. 10A. For the 300 Hz input, the fiber transducer position is shown to be curved in one direction along the fiber transducer length, and a high output voltage is produced. For the 440 Hz input plot shown in FIG. 10B, the fiber transducer position is shown to be curved in two different directions, with two sites of direction change along the fiber transducer length. This results in a low output voltage production.

It is recognized herein that the Young's modulus of the membrane determines the order and wavelength of the vibrational modes of the membrane. This is discerned as follows. The eigenfrequencies of a simply-supported rectangular plate with side lengths a and b are given by:

$$\omega_{mn} = \pi^2 \left( \frac{m^2}{a^2} + \frac{n^2}{b^2} \right) \sqrt{\frac{D}{\rho}}. \tag{1}$$

Here, $\rho$ is the density and D is the bending stiffness of the plate. The bending stiffness $$D = \frac{Eh^3}{12(1 - v^2)}$$

is a function of the Young's modulus E, thickness h, and Poisson's ratio v. The wavelength of the vibrational modes of such a plate is given by:

$$\lambda = 2\pi \sqrt{\frac{1}{\omega} \left( \frac{E}{12\rho(1 - v^2)} \right)^{1/4}} \sqrt{h}. \tag{2}$$

It is recognized herein that Expression (2) shows that at a given frequency $\omega$, materials with relatively higher Young's modulus exhibit lower order modes and longer characteristic wavelengths compared to relatively lower modulus materials.

With this recognition, the inventors herein discovered that an acoustic fabric having a relatively higher Young's modulus tends to exhibit lower order modes and to cause unidirectional bending of a fiber transducer coupled to the fabric. This unidirectional bending results in a higher fiber transducer output, as demonstrated above. Conversely, acoustic fabric having a relatively lower Young's modulus tends to exhibit higher order modes and to cause multi-directional bending of a fiber transducer coupled to the fabric. This multi-directional bending results in a lower fiber transducer output, as demonstrated above. As a result, higher Young's modulus-fabrics can achieve superior acoustic sensing performance over relatively lower Young's modulus-fabrics.

To analyze the impact of the modulus of a textile fabric fiber matrix on the performance of the fiber transducer in the audible frequency range, the performance of the fiber transducer was simulated for an arrangement of the fiber transducer mounted on a membrane having the Young's modulus that is characteristic of typical cotton yarns, 18 MPa, and for an arrangement of the fiber transducer mounted on a membrane having the Young's modulus that is characteristic of typical Twaron yarns, 108 GPa.

Figure 11A:
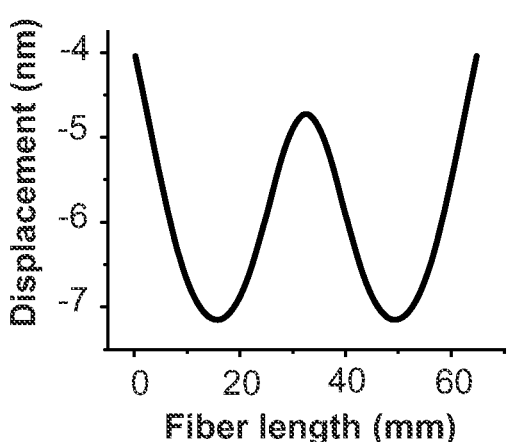
FIG. 11A is a plot of the simulated fiber transducer displacement contour resulting from an acoustic input at a frequency of 300 Hz for the arrangement of the fiber transducer of FIG. 2 on a cotton-modulus membrane.
Figure 11B:
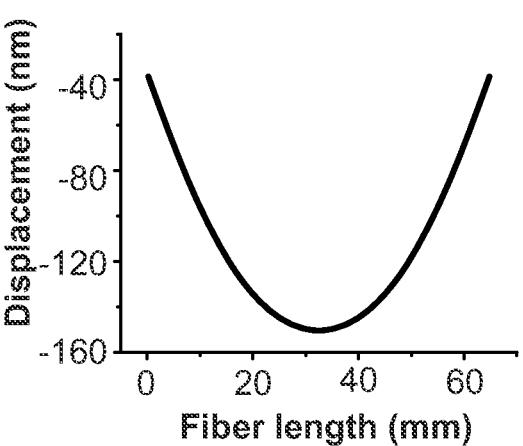
FIG. 11B is a plot of the simulated fiber transducer displacement contour resulting from an acoustic input at a frequency of 300 Hz for the arrangement of the fiber transducer of FIG. 2 on a Twaron-modulus membrane.

FIG. 11A is a plot of the simulated fiber transducer displacement contour resulting from an acoustic input at a frequency of 300 Hz for the arrangement of the fiber transducer on a cotton-modulus membrane. FIG. 11B is a plot of the simulated fiber transducer displacement contour resulting from an acoustic input at a frequency of 300 Hz for the arrangement of the fiber transducer on a Twaron-modulus membrane. As demonstrated here clearly, the fiber transducer exhibits a bi-directional bending contour on the cotton-modulus membrane, and exhibits unidirectional bending contour on the Twaron-modulus membrane; this is due to the fact that the modes developed by the Twaron-modulus membrane are of lower order and longer wavelength.

It is discovered herein that the electrical output of the fiber transducer involves integration over the fiber transducer geometric curvature function. When the curvature changes direction, thereby changing polarity, there is developed a cancelation effect and a diminished fiber transducer output. In addition, the peak-to-peak displacement of the fiber transducer, when arranged on the Twaron-modulus membrane is shown to be two orders of magnitude higher than that of fiber transducer when arranged on the cotton-modulus membrane. This is due to the strong synergistic coupling between the high modulus membrane and the fiber transducer.

It is also noted that the simulated wavelength of the standalone fiber transducer matches well with the wavelength of the fiber transducer arranged on the Twaron-modulus membrane compared to the arrangement on the cotton-modulus membrane, leading to a better mechanical impedance match. Thus, the electrical output from a fiber transducer integrated on a higher-modulus membrane is understood to be higher.

Turning to structure of the acoustic fabric provided herein, a matrix of textile fibers behaves like a membrane and the discoveries described above regarding the performance of the fiber transducer when integrated with a membrane are therefore employed to design the acoustic fabric having a textile matrix and including a fiber transducer. First defining the structure of the acoustic fabric, there is shown an area of an acoustic fabric embodiment in FIG. 12. The acoustic fabric 10 in this embodiment includes at least one fiber transducer 12 that is coupled to or integrated with a matrix of textile fibers 14. Referring also to FIG. 13, the population of textile fibers 14 in the matrix includes fibers that are arranged in the warp 70 of the fabric, using the parlance of the textile field, and includes fibers that are arranged in the weft 72 of the fabric.

The impact of the Young's modulus of weft and warp fibers on the performance of the acoustic fabric herein was demonstrated by both simulation and by experiment. Experimentally, a first acoustic fabric was produced as a plain-weave textile fabric woven of staple cotton yarns in both the warp and the weft directions. A second acoustic fabric was produced as a plain-weave textile fabric with staple cotton yarns in the warp direction but with Twaron yarns in the weft direction. The two textile fabrics were woven of the same thickness, weight, and dimensions. The only difference was the inclusion of Twaron filament yarns in the weft of the second textile fabric. A fiber transducer 12 was coupled to the surface of each of the two fabrics by a coupler 74 at multiple coupling sites to establish vibrational coupling between each textile fabric matrix and a fiber transducer. The transducer coupling was in this embodiment sewn stitches, and the number of sewing points was four for an 8 cm-long fiber transducer. In one embodiment, there is included at least one coupler, such as a sewing stitch, for each 2 cm of fiber transducer. In another embodiment, there is included a coupler, such as a sewing stitch, for each section of fiber transducer having a length of between about 1 cm and about 4 cm.

Figure 14:
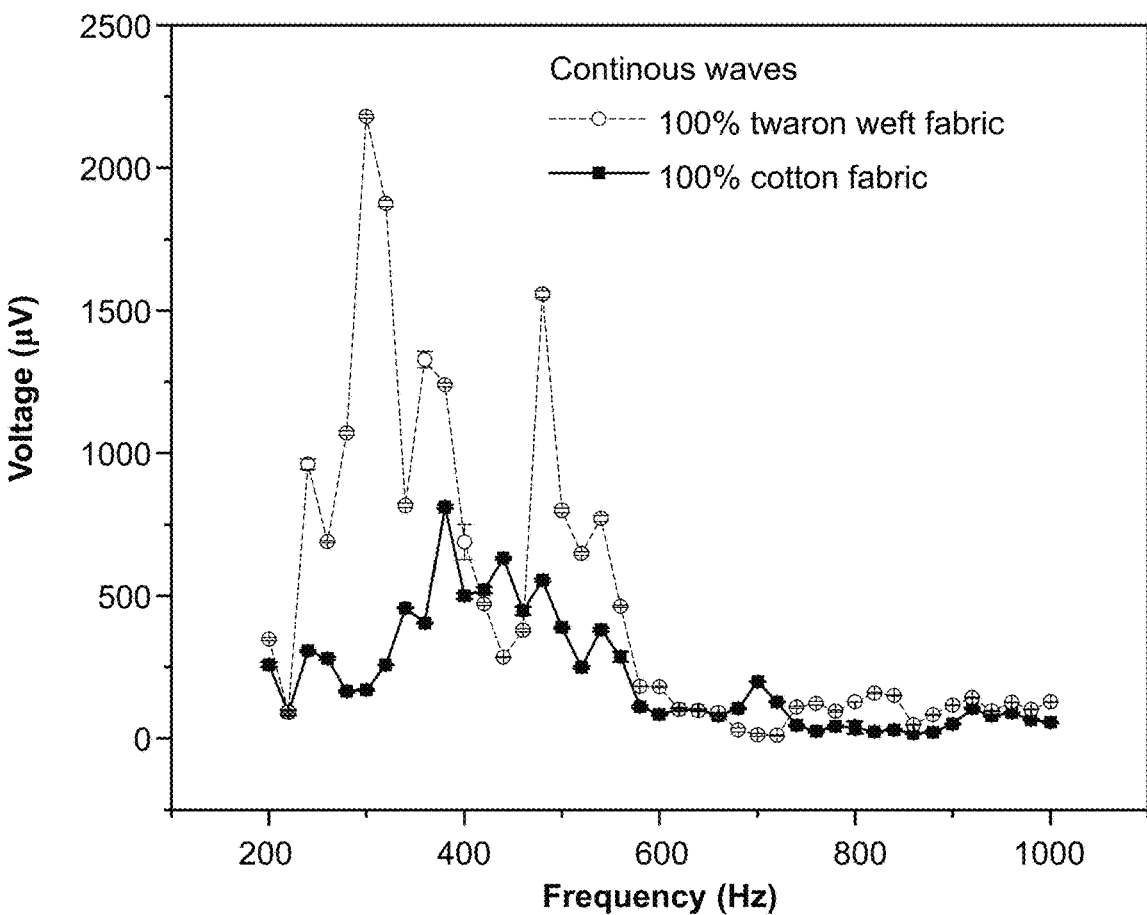
FIG. 14 is a plot of the measured output voltage produced by the fiber transducer of FIG. 2 coupled to an all-cotton textile matrix and is a plot of the measured output voltage produced by the fiber transducer of FIG. 2 coupled to a textile matrix having a cotton warp and a Twaron weft.

The two acoustic fabrics were separately subjected to continuous sound waves in the manner shown in FIG. 7; each fabric was ironed and then placed in a square 17 cm aluminum frame clamped in the upright position. FIG. 14 is a plot the output voltage response of each of the two fiber transducers as a function of input sound frequency, for the all-cotton fabric and for the cotton warp-Twaron weft fabric. The frequency response characterization reveals that the acoustic fabric having a Twaron-weft outperformed the all-cotton acoustic fabric at 35 of the 41 frequencies between 200 Hz and 1000 Hz. The sensitivity of the cotton warp-Twaron weft acoustic fabric reached 6.1 mV, compared to a 4.1 mV sensitivity of the all-cotton acoustic fabric. This large difference is attributed to the high modulus of the Twaron filaments compared with the relatively lower modulus of the cotton yarns. The cotton-Twaron combination results in a textile matrix Young's modulus of about GPa, compared with an all-cotton matrix Young's modulus of about 57 MPa.

The 6.1 mV sensitivity achieved by the cotton-warp Twaron-weft fabric is also a result of the use of a continuous fiber transducer length that is coupled with the textile matrix of the fabric throughout the fabric area, rather than a plurality of separated and distinct acoustic transducer sites. This level of sensitivity is higher than that of many commercialized condenser and dynamic microphones, demonstrating that indeed, the acoustic fabrics functions as an efficient sound collector and transducer in the audible frequency range.

With this understanding then, in general, in embodiments provided herein, the effective Young's modulus, E, of the textile matrix of the acoustic fabric, that is, the effective Young's modulus, E, of®the population of textile yarns, filaments, and other staples that are included in the acoustic fabric textile matrix is at least about 1 GPa. Whether the acoustic fabric includes only one textile material species or more than one different textile material species, the effective modulus of the acoustic fabric textile matrix is at least about 1 GPa. For any number of different textile species included in the acoustic fabric textile matrix, the effective Young's modulus of the textile species combination is at least about 1 GPa.

Examples of species of textile fiber materials for inclusion in the acoustic fabric textile matrix are cotton fibers, polyester fibers, rayon fibers, Biaxially-oriented polyethylene terephthalate (BoPET or Mylar) fibers, para-aramid fibers such as Twaron® fibers, Endumax® or other ultra-high-molecular-weight polyethylene (UHMWPE) fibers, polyparaphenylene terephthalamide (Kevlar®) fibers, silk fibers, and other suitable fabric textile material fibers. The textile materials have a selected form factor, such as thread, yarn, filament, braid, roping, floss, or other suitable form factor; thread, yarn or other material length can be twisted, tangled, or otherwise configured. In one embodiment, the acoustic fabric textile matrix consists of a single textile material and a single form factor, such as cotton yarn; in this embodiment, one textile material is included in the acoustic fabric textile matrix. In other embodiments, the acoustic fabric textile matrix includes at least two different textile materials, forming a hybrid textile material. In further embodiments, the acoustic fabric textile matrix includes two different textile materials; and in other embodiments, the acoustic fabric textile matrix includes a plurality of different textile materials, including more than two different textile materials.

In one embodiment, the acoustic fabric includes a hybrid textile material that includes one, or at least one, relatively high-modulus material, such as Twaron, along with one, or at least one, relatively low-modulus material, such as cotton. Thus, in some embodiments, the effective modulus of the textile matrix is tuned by inclusion of two or more different textile materials that together provide the effective modulus of the textile matrix. In one embodiment, a first textile species in the textile matrix has a Young's modulus of at least about 1 GPa, and a second textile species in the textile matrix has a Young's modulus that is less than about 1 GPa. In another embodiment, a first textile species in the textile matrix has a Young's modulus of at least about 25 GPa, and a second textile species that includes cotton, or a second textile species that has a Young's modulus that is less than about 1 GPa.

The textile matrix of the acoustic fabric is in one embodiment woven, with weft and warp species, as shown in FIG. 13, or is assembled in another manner. The textile weave is in embodiments herein a plain weave, a basket weave, a twill weave, a satin weave, a jacquard weave, a gauze weave, a sateen weave, a herringbone weave, a pile weave, a tapestry weave, a checquered weave, a celtic weave, an oxford weave, a double cloth weave, a waffle weave, a lappet weave, a striped weave, or other suitable weave. In other embodiments herein, the textile matrix is not a woven matrix, and instead is knit matrix, a crochet matrix, or other matrix. In general, the textile matrix is an arrangement of textile fibers that are coupled together.

In embodiments herein, the textile matrix of the acoustic fabric has an extent with a continuous length that is at least about one meter, or at least about five meters, or at least about 10 meters. The textile matrix has a width that is at least about one meter, or at least about five meters, or at least about meters. In embodiments herein, the area of the textile matrix is at least about one square meter, or at least about five square meters, or at least about 10 square meters. The scalability of the thermal drawing production of the fiber transducer is-well matched with the scale of industrial weaving processes for producing long continuous areas of acoustic fabric. For example, one single thermal draw of a 20 cm-long fiber transducer preform produces a drawn fiber transducer that is about 80 meters long. The fiber transducer length yielded by a single draw can thus results in an embodiment herein having at least about 50 square meters of acoustic fabric with about 0.2% of the volume of the acoustic fabric provided by the fiber transducer. In other embodiments, the acoustic fabric has an area of at least about 20 square meters of textile fiber matrix and about 0.2% volume of the acoustic fabric provided by the fiber transducer. The edges of the textile matrix are finished in any convenient construction that is suitable for a given application.

Figure 12:
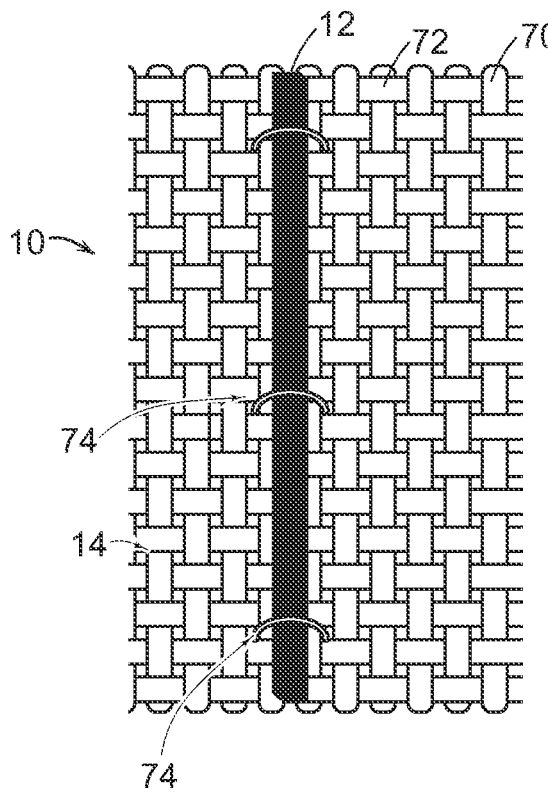
FIG. 12 is a schematic view of a section of the fiber transducer of FIG. 2 coupled to a textile matrix.
Figure 13:
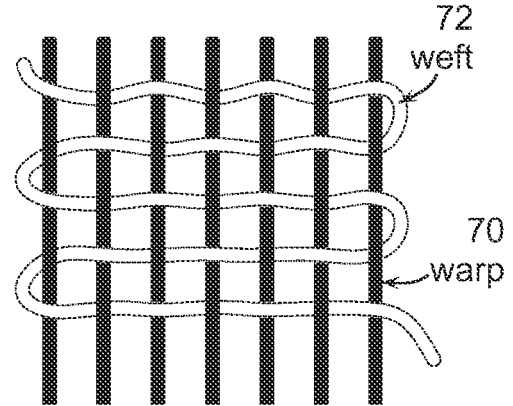
FIG. 13 is a schematic view of the weft and warp weave directions of a textile.

FIG. 12 schematically shows sites at which a coupler 74 couples a fiber transducer 12 to a population of textile fibers in a textile fabric 14 in the formation of acoustic fabric. In one embodiment herein, a fiber transducer is coupled to a textile fabric by a suitable coupling mechanism, or coupler. In embodiments herein, a fiber transducer coupler is implemented as a sewing stitch, such as a running stitch, a basting stitch, a catch or cross stitch, a zigzag stitch, a buttonhole stitch, a slip stitch, an embroidery stitch, or other stitch. In embodiments herein, the fiber transducer coupler is implemented as a knot, a tie, a fastener, an adhesive tape, an adhesive glue, a staple, a connector, an intermediate adhesive layer, a clip, and/or other suitable coupling mechanism. In a preferred embodiment, the coupling mechanism is a textile sewing stitch using a textile that is included in the textile matrix.

A selected coupling mechanism is included at periodic sites along the length of the fiber transducer. In one embodiment, a separation distance of no less than between about 1 cm and about 4 cm is provided between adjacent couplers along the length of the fiber transducer. In a further embodiment, a separation distance of no less than about 2 cm is provided between adjacent couplers. In a further embodiment, a coupler is provided for about every 2 cm of length along the fiber transducer.

Figure 15:
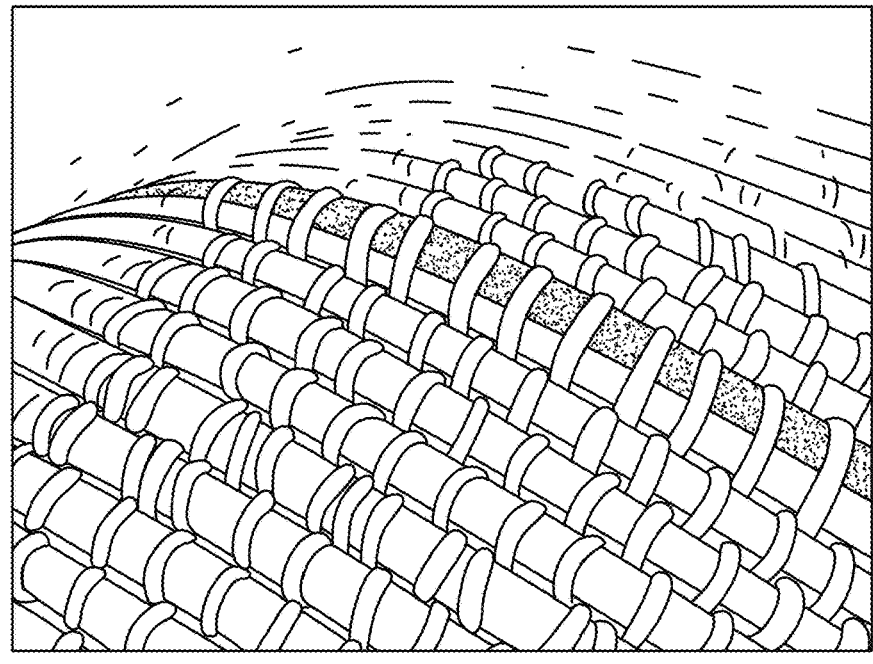
FIG. 15 is a photograph of the acoustic fiber of FIG. 1 including the fiber transducer of FIGS. 1 and 2 woven into a textile matrix having a cotton warp and a Twaron weft.

In a further embodiment, a fiber transducer is coupled to a textile fabric by weaving or otherwise incorporating the fiber transducer with the textile matrix. The fiber transducer is thereby incorporated into the acoustic fabric arrangement during the weaving process. In one embodiment of such, the fiber transducer is included in the weft of the textile or in the warp of the textile. FIG. 15 is a photograph of such a weaving arrangement, with a fiber transducer 12 woven in the weft direction of a textile fabric 14.

In one example embodiment for production of the acoustic fabric with this arrangement, a loom, such as an 8-harness floor loom is employed, and a first section of the fabric is woven. Then, without changing the weaving shed, which is the combination of warp yarns that are raised in order to insert a weft, a second weft yarn is inserted. The fiber transducer is placed on a rigid form, such as a plastic strip, and inserted in the fabric as a weft, again without changing the shed. The fiber transducer can be positioned by sliding it off of the plastic strip onto the pair of weft yarns, preferably without bending or twisting the fiber transducer. The plastic strip is then removed and weaving resumed as normal, with the next weft yarn inserted in a new shed. This method minimizes stress on the fiber transducer and insures that the fiber transducer is positioned on top of the waft yarns, rather than settled into a position between or below them as a result of compression form weft yarns.

It is discovered herein that the horizontal stress in the plane of the textile matrix is orders of magnitude larger than the compressive stress, which causes bending of the fiber transducer and which produces the acoustic sensing response of the fiber transducer. To maximize this response, in preferred embodiments the piezocomposite domain of the fiber transducer is disposed asymmetrically with respect to the plane of the fabric matrix. The strain imposed on the acoustic fiber is proportional to the distance between the piezocomposite domain and the fabric matrix. An increase in imposition of strain increases the stress applied to the piezocomposite domain and produces an improved performance by the piezocomposite domain.

In embodiments herein, one or at least one separate and distinct fiber transducer is included in the acoustic fabric; for example, in one embodiment, one continuous length of fiber transducer is coupled or woven into the fabric matrix. In other embodiments, two or more separate and distinct fiber transducers are included in the acoustic fabric. Each separate fiber transducer is arranged with the fabric matrix in a manner that is either the same as or different from the arrangement of other fiber transducers in the acoustic fabric.

The acoustic fabric is in embodiments herein arranged in a selected geometry for in intended application. For example, the acoustic fabric is arranged as a wearable human garment in some embodiments, including shirt, top, pants, shorts, coat, dress, skirt, blouse, shawl, scarf, gloves, socks, hat, undergarment, sleep apparel, athletic apparel, or other garment. The acoustic fabric is in other embodiments included in another structure such as a glove and a shoe.

In operation, the acoustic fabric, in whatever configuration is selected for operation, is exposed to environmental acoustic sound. The electric signal produced by the acoustic fabric is captured by wires and processing componentry for indication of the input, in the manner described above. In one embodiment, the output of fiber transducer of the acoustic fabric is connected to processing componentry to filter out noise above about 10 kHz and below about 60 Hz, and in a further embodiment, the output is processed to amply the signal between 60 Hz and 10 kHz.

In one particularly effective embodiment, the output of the fiber transducer of the acoustic fabric is connected to a fiber computer for processing, digital storage, and connection to output devices, including a display, acoustic speaker, or other transducer, that are all connected to the acoustic fabric. A power source in the form of a fiber battery is also in one embodiment included in the acoustic fabric, connected to the fiber transducer, fiber computer, output devices, and any other componentry requiring power within the acoustic fabric. The fiber computer and fiber battery are integrated with the textile fibers of the acoustic fabric, by coupling to textile fibers, weaving with textile fibers, or other suitable integration paradigm. The fiber computer is implemented and integrated into the textile fiber matrix as taught in U.S. Patent Application Publication No. 2012/0201121, published Jul. 1, 2021, and the fiber battery is implemented and integrated in the textile fiber matrix as taught in U.S. Patent Application Publication No. 2020/0028198, published Jan. 23, 2020, the entirety of both of which are hereby incorporated by reference.

The performance and form factor of the acoustic fabric enables a wide range of applications that have heretofore been unaddressed in a meaningful manner. For example, the recognition and localization of acoustic sources are of importance for a wide range of applications ranging from enabling hearing impaired to discern speech in noisy environments, to the diagnostics of respiratory obstruction, to failure monitoring in structures and human-machine interactions. Conventional technologies for this purpose rely on directional microphone arrays which are typically bulky and do not lend themselves to mobile deployment.

Figure 16B:
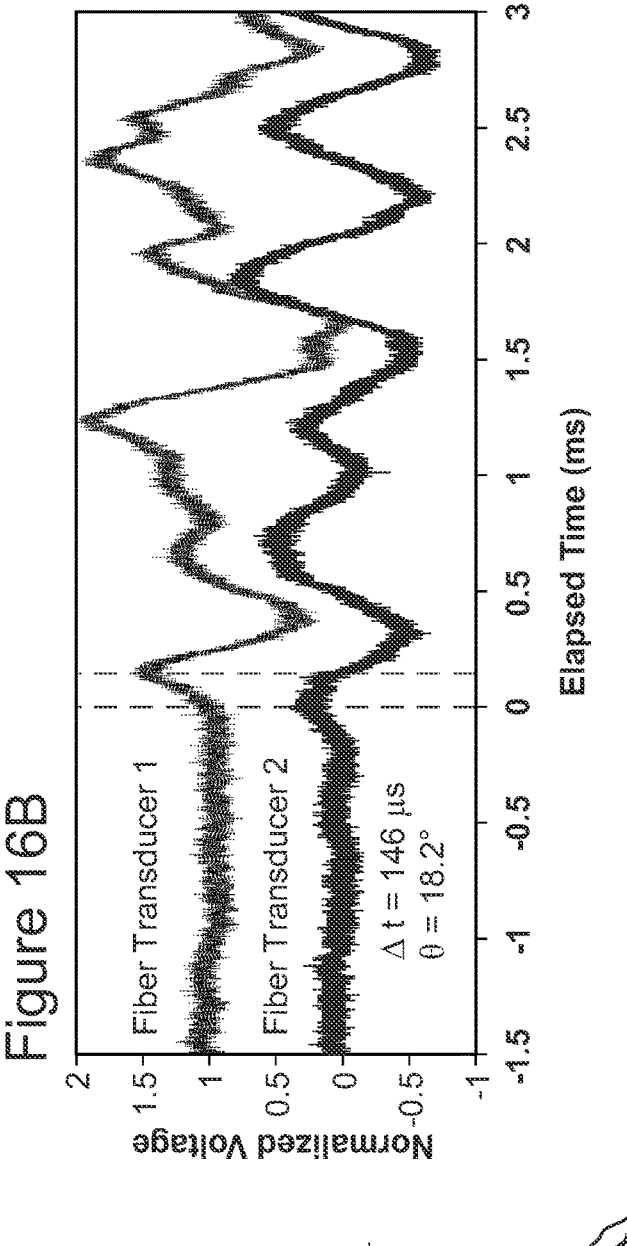
FIG. 16B is a plot of measured output voltage as a function of time for each of the two fiber transducers in an experimental acoustic fabric as-shown in FIG. 16A.
Figure 16A:
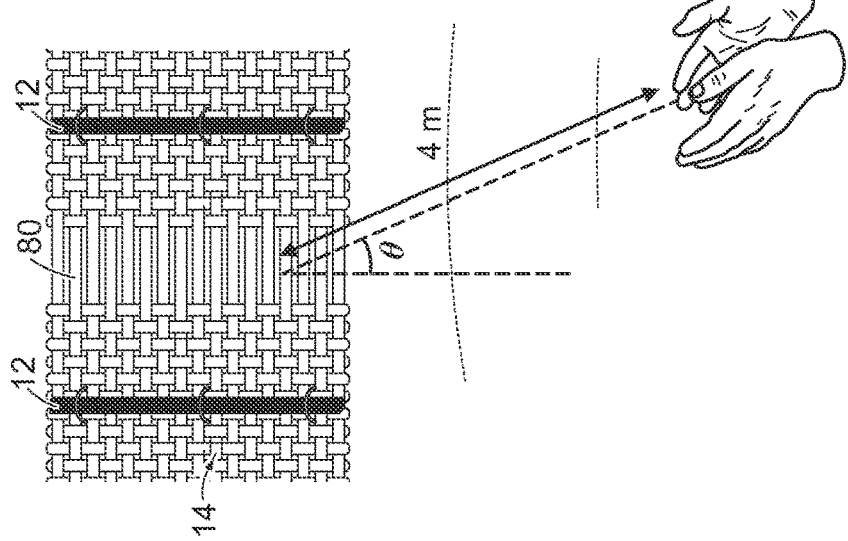
FIG. 16A is a schematic view of an acoustic fabric provided herein including a plurality of fiber transducers coupled to a textile matrix.

Referring to FIG. 16A, in one embodiment provided herein, two separate and distinct, unconnected fiber transducers 12 are included in an acoustic fabric, coupled to the textile matrix 14. It is preferred in this embodiment to remove a plurality of yarns, such as warp yarns, between the location of the two transducers 12, as shown in FIG. 16A, to vibrationally insulate one side of the acoustic fabric from the other and thus minimize the vibration transport between the locations of the two fiber transducers. The acoustic fabric in this embodiment thereby includes a portion 80 that reduces vibrational transmission between fabric regions adjacent to the reduced vibration portion 80. This acoustic fabric arrangement enables sensing and determination of sound directionality.

As shown in FIG. 16A, if a sound, such as a hand clap, is initiated some distance from the fabric, with an angle, θ, to the normal, the time delay between the sound peak reception at each fiber transducer corresponds to a difference in the path length between the two fiber transducers, allowing for precise derivation of the direction of the sound, with very low error. This directional sound detection is useful for individuals with hearing aids to listen in specific directions while removing background noise, for law enforcement seeking to detect a source of a gunshot, and for pedestrians to warn of an oncoming vehicle.

FIG. 16B is a plot of normalized voltage, as a function of time, for an experimental acoustic fabric having the configuration of FIG. 16A and having the experimental fiber transducer components described above. A hand clap 4 m from the fabric was conducted at an angle of 18.2° from the normal. The time delay between the two fiber transducers, here 146 microseconds, corresponds to the difference in path length between the two fiber transducers, and enables determination of the directional angle of incidence of the sound. The error in sound direction determination from the acoustic fabric is only about 1%, and therefore is acceptable for the full range of directional sound detection applications.

Turning to further embodiments, it is noted that, as explained above, the piezoelectric domain of the fiber transducer is capable of both the piezoelectric effect and the reverse piezoelectric effect. The reverse piezoelectric effect occurs when the piezoelectric domain produces an acoustic signal, by mechanical stress or strain waveform, in response to an applied electric field. Thus the fiber transducer and the acoustic fabric can emit sound based on electrical signals that are delivered to the conductors within the fiber transducer for imposing a voltage across the piezoelectric domain; in one embodiment, audible sounds are broadcast by the acoustic fabric by input of a modulated AC voltage to the fiber transducer of the acoustic fabric.

Figures 17A, 17B:
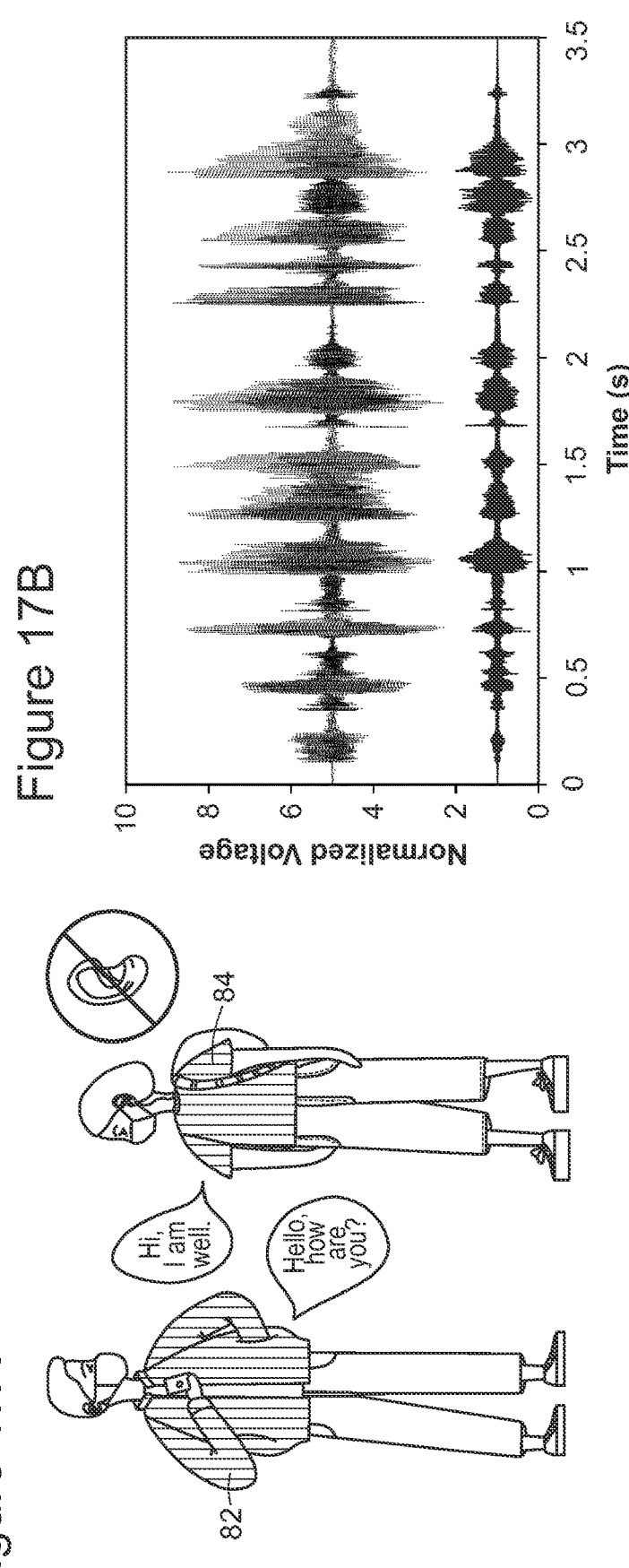
FIG. 17A is a schematic view of a human interaction employing human garments formed of the acoustic fabric of FIG. 1 for both microphone and speaker operation.
FIG. 17B is a plot of normalized measured voltage as a function of time for the audio spectrum of the phrase "acoustic fiber records audible sound," as emitted by one acoustic fabric, operating as an audio fabric speaker, and as detected by another acoustic fabric, operating as an audio fabric detector.

In one embodiment, a plurality of fiber transducers and/or acoustic fabrics are employed to send and receive sound there between. Thus, the fiber transducer and acoustic fabric enable audible sound communication. Specifically, one fiber transducer and/or acoustic fabric is operative as both a microphone and an acoustic speaker. In one embodiment, a first acoustic fabric is operated to emit sound under an AC voltage input, operative as an acoustic speaker, with a second or more acoustic fabric being operated as a microphone. A human interaction employing this arrangement is represented in FIG. 17A, and represents how individuals suffering from language and/or hearing impairments are well served by this application. A first individual is shown wearing an acoustic fabric fashioned as a jacket 82 and a second individual is shown wearing an acoustic fabric fashioned as a shirt 84. The acoustic fabric of each garment is controlled to operate as both a microphone and a speaker so that communication is enabled between the two individuals.

FIG. 17B is a plot of normalized voltage as a function of time for the audio spectrum of the phrase "acoustic fiber records audible sound," as emitted by one acoustic fabric, operating as an acoustic fabric speaker, and as detected by another acoustic fabric, operating as an acoustic fabric detector. The fabric speaker performance is better than many commercial thin-film audio speakers, such as silver nanowire, carbon nanotube film and graphene foam-based speakers. These applications demonstrate that the combination of emission and detection capabilities of the acoustic fabric enables the measurement of distance and direction and enables acoustic communication between acoustic fabrics; this serves as a way to effect automated social distancing or other applications. For example, applications of covert communication, underwater communication, and other such applications, are enabled by the acoustic fabric.

In a further embodiment herein, there is exploited the acoustic fabric's high sensitivity and impedance match with human skin, thereby enabling physiological sensing. In one application, there is addressed medical heart monitoring.

Cardiovascular disease (CVD) is the leading cause of mortality throughout the world. The acoustic fabric provided herein is operative to sense the heart sounds, and therefore enables the monitoring of a heart condition in real time, for heart auscultation, a fundamental tool in the diagnosis of CVD and heart abnormalities.

Figure 18B:
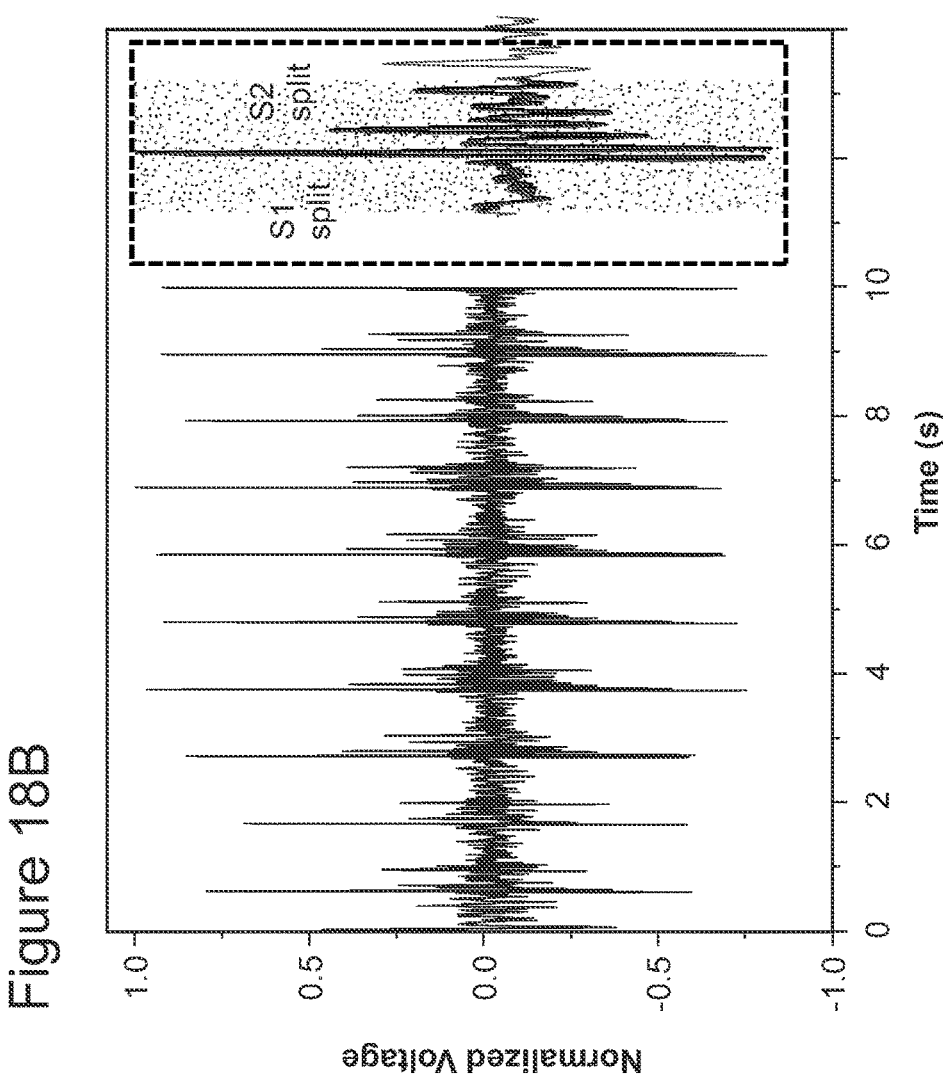
FIG. 18B is a plot of normalized measured voltage as a function of time of heart beat, as-produced by the fiber transducer arranged in the manner shown in FIG. 18A.
Figure 18A:
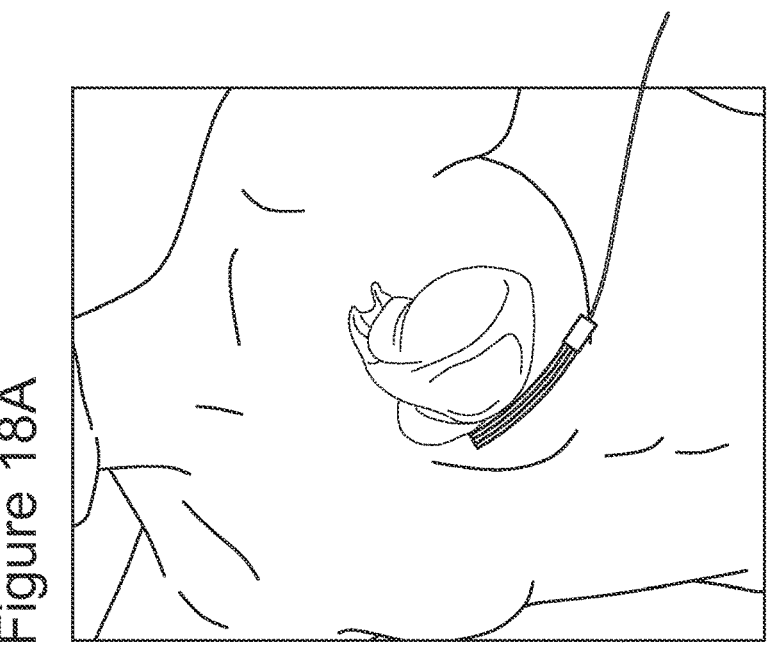
FIG. 18A is a schematic view of the fiber transducer of FIG. 2 positioned for sensing heart sounds.

FIG. 18A shows a fiber transducer 12 attached to the chest of a person to efficiently captures cardiac signals from the heart 82, thereby operating as a skin-interfaced stethoscope. The fiber transducer 12 is shown here for clarity, but it is to be understood that the acoustic fabric is also employed in embodiments herein. FIG. 18B is a plot of experimentally measured fiber transducer output, having an electrical signal indicative of heart beat. The signal, with a signal-to-noise ratio as high as 30 dB, surpasses recent thin-film acoustic devices and conveys a wealth of information about the wearer's cardiovascular system.

From the heart signal data produced by the fiber transducer, as shown in FIG. 18B, the resting heart rate is determined from this data to be beats per minute. The fiber transducer also clearly detects the louder S1 sound resulting from the closing of the mitral and tricuspid valves and the weaker S2 sound produced by the closure of the aortic and pulmonic valves. Most strikingly, the splitting characteristic of S1, which occurs because the mitral valve closes before the tricuspid valve, as well as the splitting of S2, which occurs because aortic valve closure normally precedes pulmonic valve closure, are both captured, an accomplishment that has been previously unachievable with thin-film acoustic devices. Furthermore, the dynamic change in S2 splitting which normally occurs during respiration or inspiration is also detected. The ability to detect the mechanical action of the heart with the acoustic fabric thereby enables wearers to precisely monitor their heart and respiratory condition, and to do so in a comfortable, continuous, real-time, and long-term manner.

EXPERIMENTAL EXAMPLES

A fiber transducer was produced by dissolving Poly (vinylidene fluoride-co-trifluoroethylene) P(VDF-TrFE) Piezotech-Arkema KOP, King of Prussia, PA, (FC 30) with 30 mol % TrFe in dimethylformamide (1:10, w:w) by continuous stirring for 5 h. Barium titanate particles having an extent of 200 nm were added and stirred for 12 h to form a suspension. The ratio of $BaTiO_3$ to P(VDF-TrFE) was 1:5 by weight. The suspension was sonicated for 2 h, changing the water every 15 min to prevent it from warming up. The suspension was stirred again for 20 h, and then sonicated for 3 h, changing the water every 15 min. It was then mixed in a centrifugal mixer at 3500 rpm for 10 minutes. The mixture was poured onto a glass substrate to form a film as the DMF evaporated. After the drying at room temperature for one day, the film was removed from the DMF solution and dried in a 60° C. vacuum oven for five days before use.

A rectangular preform with dimensions of 2.5 cm×1.38 cm×18 cm was formed to correspond to the fiber transducer arrangement of FIG. 3. A hot press was used to press the 600 micron-thick piezocomposite, CPE charge collectors of 1.4 mm thickness, and 2 mm-thick SEBS layers into sheets of the appropriate thickness. All the materials were then cut and assembled into a mold according to the fiber architecture. Gaps were left in the CPE layer, into which 50 μm copper wires were fed during the thermal drawing process using a convergence technique. The SEBS cladding, CPE electrodes, and piezoelectric composite layer were consolidated using a hot press at 100° C. The preform was drawn in a three-zone vertical tube furnace with a top-zone temperature of 120° C., a middle-zone temperature of 252° C., and a bottom-zone temperature of 80° C. The fiber dimensions were monitored with laser-micrometers and the cross-section dimensions of the fiber are scaled down 20× compared to those of the preform.

Figure 19:
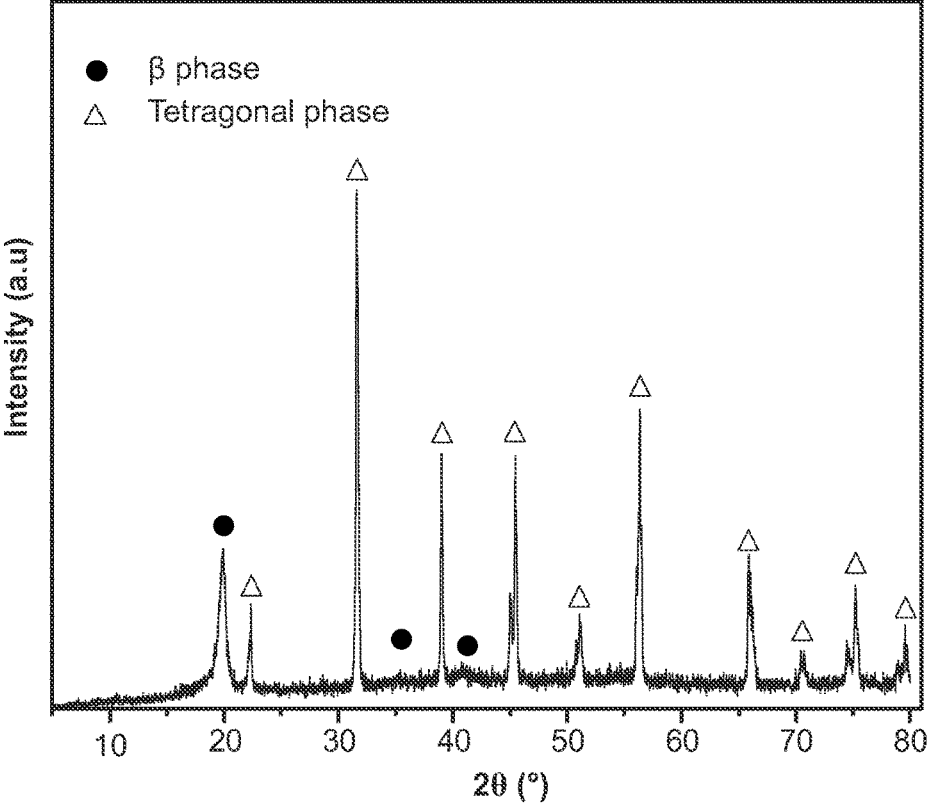
FIG. 19 is a plot of measured X-ray diffraction characterization of the piezodomain of an experimental fiber transducer provided herein after being thermally drawn.

FIG. 19 is a plot of the X-ray diffraction characterization of piezodomain of the fiber transducer after the thermal draw. The piezocomposite shows the formation of (3 phase of P(VDF-TrFE) and tetragonal phase of $BaTiO_3$. Despite high pressures and temperatures as well as chemical treatments associated with the preform fabrication and thermal drawing processes the $BaTiO_3$ nanoparticles are maintained in the monocrystalline tetragonal phase, in a non-centrosymmetric crystallographic structure that exhibits exceptional piezoelectric properties.

Figure 20:
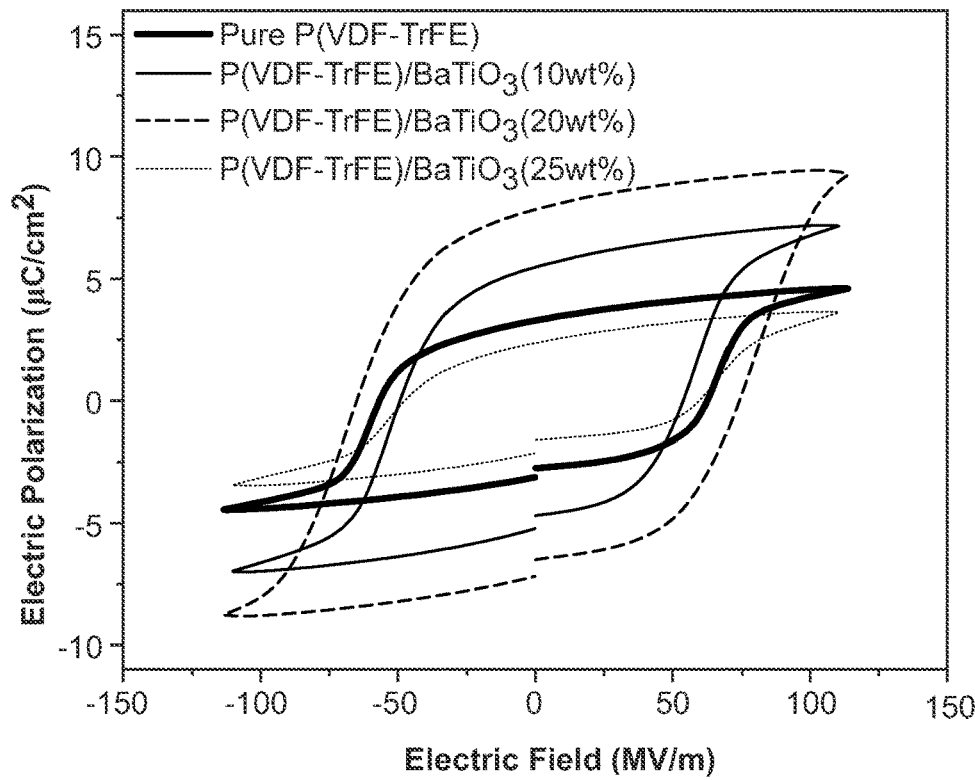
FIG. 20 is a plot of the measured electric polarization versus electric field hysteresis loops for an experimental fiber transducer piezoelectric domain including no $BaTiO_3$ nanoparticles and for experimental fiber transducers including varying weight percentages of $BaTiO_3$ nanoparticles in the piezoelectric domain.

To determine the impact of $BaTiO_3$ nanoparticle weight percentage on performance of the piezoelectric domain, fiber transducers having a piezoelectric domain including 10 wt %, 20 wt % and 25 wt % $BaTiO_3$ nanoparticles, all 200 nm in extent, were produced. FIG. 20 is a plot of the electric polarization versus electric field hysteresis loops for a fiber transducer piezoelectric domain including no $BaTiO_3$ nanoparticles, i.e., pure P(VDF-TrFE), and fiber transducers with varying weight percentages of $BaTiO_3$ nanoparticles. The results indicate that the P(VDF-TrFE) piezoelectric domain loaded with 20 wt % $BaTiO_3$ nanoparticles exhibits significantly improved ferroelectric properties with a remnant polarization as high as 10 $\mu C/cm^2$. This nanoparticle loading level is determined also to yield an effective piezoelectric coefficient $d_{31}$ coefficient of about 80 pC/N for the piezoelectric domain.

Aside from this experimental example description, it is therefore preferred in embodiments herein that between about 15 wt % and about 25 wt % piezoelectric particles be included in a piezoelectric polymer matrix of the piezoelectric domain and it is most preferred that about 20 wt % piezoelectric particles be included. In embodiments herein the piezoelectric domain has a piezoelectric coefficient $d_{31}$ of at least about 60 pC/N, more preferably has a piezoelectric coefficient $d_{31}$ of at least about 70 pC/N, and most preferably has a piezoelectric coefficient $d_{31}$ of at least about 80 pC/N for the piezoelectric domain of the fiber transducer.

Continuing with experimental example data, an acoustic fabric was woven using an 8-harness floor loom. The warp yarn had a size 20/2 cotton with a set of 60 ends per inch and was threaded through a 12-dent reed. Two types of yarn were used for the weft: a size 5/2 cotton yarn and a 1210 dtex Twaron yarn (Tejin Aramid, Arnhem, The Netherlands). Labeled units of measurement vary between yarn types: a size 5/2 cotton yarn is equal to 2362 dtex, or 1.95 times the weight of the selected Twaron yarn per meter. The textile matrix was woven at 16 wefts per inch.

A plain weave construction was used throughout the fabric, with cotton warp yarn and Twaron weft yarn. Four strands of untwisted Twaron yarn were used in the weft direction. To weave the acoustic fabric, the lower half of the fabric was woven first, stopping after weaving four picks of satin weave. Without changing the shed, i.e., without changing the combination of warp yarns that are raised in order to insert a weft, a second weft yarn was inserted. A length of fiber transducer was placed on a rigid plastic strip and inserted into the fabric as a weft, again without changing the shed. The fiber transducer was moved into position by sliding it off the plastic strip onto the pair of weft yarns, taking care not to bend or twist it. The plastic strip was then removed and weaving resumed as normal, with the next weft yarn inserted in a new shed. The fiber transducer was 15 cm long×0.12 cm wide×0.69 mm thick. The woven acoustic fabric was 30 cm long×24 cm wide×1 mm thick. The volume fraction of the fiber transducer occupying the acoustic fabric was therefore only 0.2%. A photograph of the resulting acoustic fabric is shown in FIG. 15, as described above.

Figure 21:
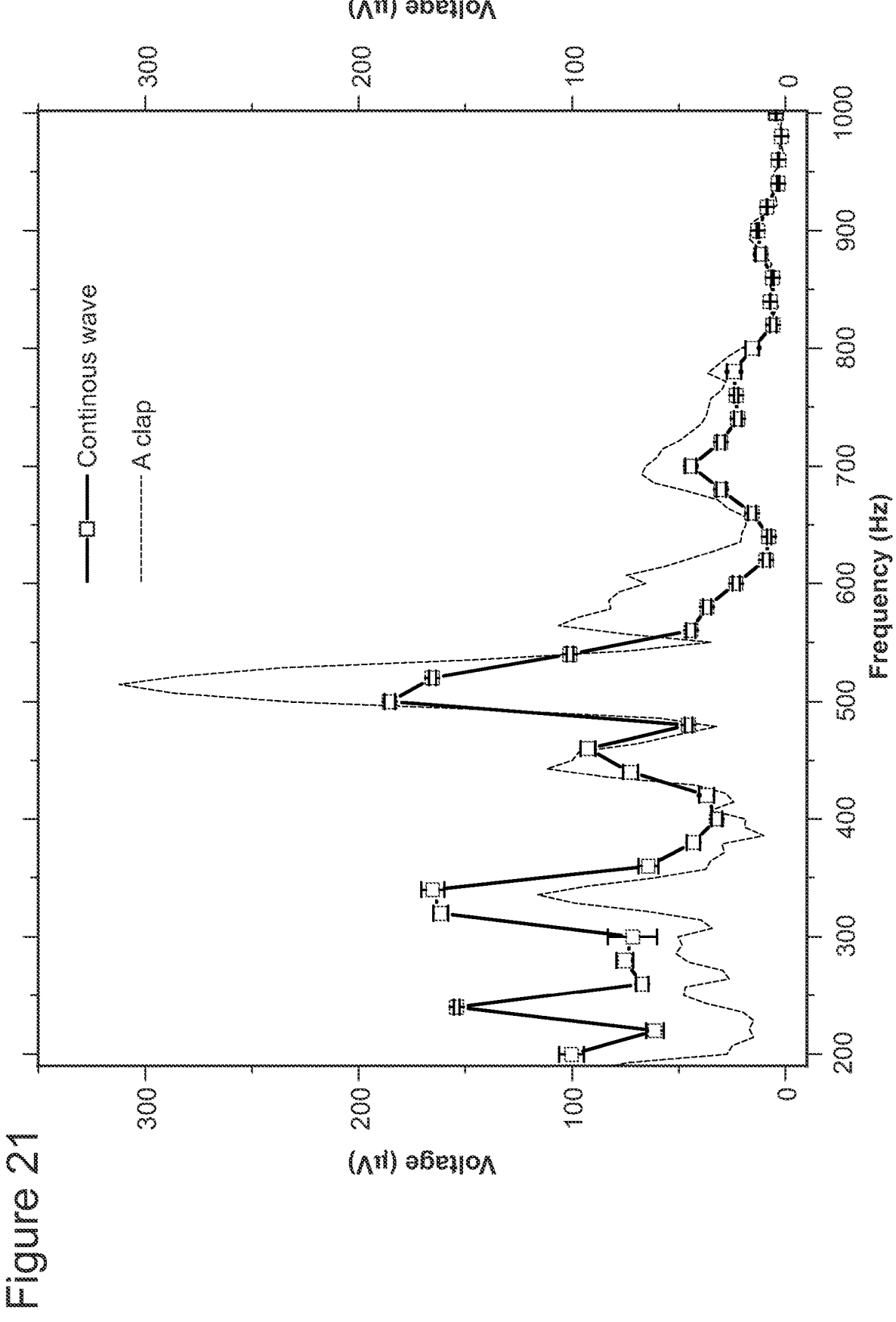
FIG. 21 is a plot of measured output voltage as a function of input sound frequency and measured output voltage in response to an audible clap for an experimental acoustic fabric including cotton weft and Twaron warp.

FIG. 21 is a plot of the output voltage of the acoustic fabric as a function of input sound frequency, using the arrangement shown in FIG. 7. The fabric was ironed and placed in a 17 cm×17 cm square aluminum frame, clamped in an upright position. The frame was placed on 10 cm of acoustic-insulating foam on the floor of an acoustically-damped and isolated studio. The frame was sited 2 meters from the sound source. The sound source, an acoustic speaker, was also sited on foam on the floor. A signal generator was used to control the continuous sound wave output frequency and to provide electrical power to the speaker. A dB sound meter was placed to the side of the frame, in the same plane as the fabric, and the power of the signal generator was adjusted until the desired sound pressure level was reached. Two opposing wires of the fiber transducer in the acoustic fabric were connected to a printed circuit board, which was in turn connected to an oscilloscope to record the output signal. To obtain the data shown in FIG. 21, the output voltage signal from the acoustic fabric was manipulated by fast Fourier transform to determine the output voltage.

With this measured acoustic response of the acoustic fabric, a sensitivity of 6.1 mV is demonstrated. This is higher than any conventional rigid, point microphone and conventional thin-film acoustic device. For any conventional microphone performance capability, the acoustic fiber herein is superior in its planar form factor and an extent of at least one meter, and preferably at least ten meters, that retains the traditional qualities of fabrics, such as machine washability.

Turning to other applications of the acoustic fabric, in embodiments herein, any in a wide range of functionality is integrated into the acoustic fabric. For example, light-emitting diode (LED) devices, one or more audio speakers, photodiode devices, memory devices and other active devices, transducers, and/or computer systems are integrable into the fiber transducer for optical communication, photosensing, thermal sensing, chemical sensing, drug delivery through in-fiber microfluidic channels, digital processing, data storage, output control, or other functionality, implemented as taught by Loke et al., *Matter*, V. 2, Issue 4, 786-788, April 2020, and as taught in U.S. Pat. No. 7,295,734, issued Nov. 13, 2007; U.S. Pat. No. 10,509,186, issued Dec. 17, 2019; U.S. Pat. No. 7,292,758, issued Nov. 6, 2007; U.S. Pat. No. 10,338,000, issued Jul. 2, 2019; U.S. Pat. No. 9,365,013, issued Jun. 14, 2016; and U.S. Pat. No. 7,567,740, issued Jul. 28, 2009, the entirety of each of which is hereby incorporated by reference. Battery power is included in acoustic fabric in any suitable arrangement, e.g., in fiber form, as taught in U.S. Pat. No. 10,978,217, issued Apr. 13, 2021 and in U.S. Patent Application Publication No. 2020/0028198, published Jan. 23, 2020, the entirety of both of which are hereby incorporated by reference. Digital processing of acoustic information and digital storage of acoustic information, by one or more microprocessors, microcontrollers, and memory units all provided in a computing fiber are included in acoustic fabric in the manner taught in U.S. Patent Application Publication No. 2021/0201121, published Jul. 1, 2021, the entirety of which is hereby incorporated by reference.

These applications of the acoustic fiber and fiber transducer make clear that audible sound carries an abundance of information that is important in a broad range of fields, such as communication, security, and healthcare. Traditional technologies for audible sound detection, recording, and communication heavily rely on rigid and cumbersome microphones, making their integration into wearable electronics challenging. It is demonstrated above that the fiber transducer and acoustic fabric provided herein overcome the limitations of traditional technologies to enable audible sound detection and production by a fiber and by fabric with superior performance. There is enabled the fabrication of arbitrarily long, high-performance nano-structured acoustic multi-material fiber transducer structures via thermal drawing, and weaving of the fiber transducer into a fabric matrix to produce acoustic fabric for audible sound detection and production, for communication, and for a wide range of biological sensing applications. The coupling of the fiber transducer with a textile matrix in the manner provided herein results in a synergistic coupling, in which sound transduction is a collective effect enabled by the textile matrix-transducer coupling.

The materials, designs, and configurations of the fiber transducer and acoustic fiber enable mass production of high-performance acoustic fibers and acoustic fabrics in an elegantly simple and scalable manner. These embodiments leverage a preform-to-fiber thermal drawing process in which an audible-sound transducer, capable of converting mechanical energy into electric energy, is precisely arranged with other functional materials at a prescribed position in a macroscale preform and drawn into arbitrary lengths of fiber transducer that maintains the preform cross-section with sophisticated structures, in a single and continuous step.

A synergistic combination of fiber transducer composition and microstructure control as provided herein produce a nanostructured fiber transducer that is highly sensitive to audible sound to a degree that has heretofore been unachievable in this form factor; it is demonstrated herein that the fiber transducer and acoustic fabric are capable of detecting and recording the human voice with an operational performance on par with conventional bulky microphones.

It is recognized, of course, that those skilled in the art may make various modifications and additions to the embodiments described above without departing from the spirit and scope of the present contribution to the art. Accordingly, it is to be understood that the protection sought to be afforded hereby should be deemed to extend to the subject matter claims and all equivalents thereof fairly within the scope of the invention.

We claim:

1. An acoustic fabric comprising:

a matrix of textile fibers, the matrix of textile fibers having a Young's modulus of at least about 1 GPa;

at least one acoustic fiber transducer, the acoustic fiber transducer physically coupled with the matrix of textile fibers with at least one of a coupler and a weave of the matrix of textile fibers; and said acoustic fiber transducer comprising:

a piezoelectric domain disposed between a first end and a second end of the acoustic fiber transducer, the piezoelectric domain including a piezoelectric material that is in a microscopic non-centrosymmetric crystalline phase and including a population of inorganic piezoelectric particles dispersed in the microscopic non-centrosymmetric crystalline piezoelectric material, the piezoelectric domain having a Young's modulus, $E_{piezo}$;

at least one charge collector domain in electrical connection with said piezoelectric domain and including an electrically conductive material operative to collect electrical charge generated in said piezoelectric domain;

at least one electrical conductor in electrical contact with said at least one charge collector domain and including an electrically conductive material operative to transport electrical charge from said at least one charge collector domain to at least one of said first and second ends of said acoustic fiber transducer as an output of an electrical signal indicative of input acoustic sound pressure on the matrix of textile fibers and the acoustic fiber transducer; and an outer electrically insulating acoustic energy transmission material encapsulating said piezoelectric domain, said charge collector domain, and said electric conductor between the first and second ends of the acoustic fiber transducer, said acoustic energy transmission material having a Young's modulus $E_{trans}$, greater than about 0.3 Pa and less than about 500 MPa, for conformally matching vibrational modes of the matrix of textile fibers, and wherein a ratio of $E_{piezo}/E_{trans}$ is between about 5 and about 70,000.

2. The acoustic fabric of claim 1 wherein the ratio of $E_{piezo}/E_{trans}$ is greater than that for a sensitivity of at least about 1 mV in the output electrical signal for input acoustic sound pressure of no more than about 100 dB on the matrix of textile fibers and the acoustic fiber transducer.

3. The acoustic fabric of claim 1 wherein the ratio of $E_{piezo}/E_{trans}$ is between about 1 and about 10,000.

4. The acoustic fabric of claim 1 wherein the ratio of $E_{piezo}/E_{trans}$ is between about 10 and about 2,000.

5. The acoustic fabric of claim 1 wherein the matrix of textile fibers comprises at least two different textile fiber species, including a first textile fiber species having a first Young's modulus that is at least about 1 GPa and a second textile fiber species having a second Young's modulus that is less than about 1 GPa.

6. The acoustic fabric of claim 1 wherein the matrix of textile fibers comprises at least two different textile fiber species, including a first textile fiber species having a first Young's modulus that is at least about 25 GPa and a second textile fiber species including cotton fibers.

7. The acoustic fabric of claim 1 wherein the matrix of textile fibers comprises at least two different textile fiber species, including a first textile fiber species having a first Young's modulus that is at least about 1 GPa and a second textile fiber species including cotton fibers.

8. The acoustic fabric of claim 1 wherein the matrix of textile fibers comprises at least two different textile fiber species including a first textile fiber species selected from biaxially-oriented polyethylene terephthalate fibers, para-aramid fibers, ultra-high-molecular-weight polyethylene fibers, polyparaphenylene terephthalamide fibers, and silk fibers, and a second textile fiber species having a second Young's modulus that is less than about 1 GPa.

9. The acoustic fabric of claim 1 wherein the matrix of textile fibers has an area of at least about 20 square meters and wherein no more than about 0.2% of textile fiber matrix volume is acoustic fiber transducer.

10. The acoustic fabric of claim 1 wherein the matrix of textile fibers comprises a weave of textile fibers and wherein the physical coupling of the acoustic fiber transducer with the matrix of textile fibers comprises including the acoustic fiber transducer in the weave of textile fibers.

11. The acoustic fabric of claim 1 wherein the matrix of textile fibers comprises a weave of textile fibers and wherein the physical coupling of the acoustic fiber transducer with the matrix of textile fibers comprises attachment of the acoustic fiber transducer to at least one textile fiber by at least one fiber coupler.

12. The acoustic fabric of claim 11 wherein the acoustic fiber transducer attachment to at least one textile fiber comprises a coupler selected from a sewing stitch, a knot, a fastener, a tie, and a connector.

13. The acoustic fabric of claim 11 wherein the physical coupling of the acoustic fiber transducer with the matrix of textile fibers comprises attachment of the acoustic fiber transducer to at least one textile fiber by a plurality of couplers having a separation distance between adjacent couplers of no less than between about 1 cm and about 4 cm.

14. The acoustic fabric of claim 11 wherein the physical coupling of the acoustic fiber transducer with the matrix of textile fibers comprises attachment of the acoustic fiber transducer to at least one textile fiber by a plurality of couplers having a separation distance between adjacent couplers of no less than about 2 cm.

15. The acoustic fabric of claim 1 wherein the matrix of textile fibers is arranged as a human garment.

16. The acoustic fabric of claim 1 wherein the matrix of textile fibers comprises a weave of textile fibers including cotton textile fibers in one of weave weft and weave warp, including para-aramid fibers in one of the weave weft and weave warp, and including the acoustic fiber transducer in one of the weave weft and weave warp.

17. The acoustic fabric of claim 1 wherein the piezoelectric material that is in a microscopic non-centrosymmetric crystalline phase comprises P(VDF-TrFE) including between about 20 mol % and 45 mol % TrFE.

18. The acoustic fiber of claim 1 wherein the piezoelectric domain has a weight fraction of piezoelectric β phase at least about 40%.

19. The acoustic fabric of claim 1 wherein the piezoelectric domain has a piezoelectric domain viscosity that is at least about $10^4$ Pa·s less than a charge collector viscosity of the at least one charge collector domain at a common draw temperature of the piezoelectric domain and the charge collector domain.

20. The acoustic fabric of claim 1 wherein the acoustic fiber transducer has a neutral axis of strain in a cross section of the acoustic fiber transducer and wherein the piezoelectric domain, the at least one charge collector domain, and the at least one electrical conductor are disposed together at a site in the acoustic fiber transducer cross section that is between about ten microns and about 500 microns distant from the neutral axis of strain.

21. The acoustic fabric of claim 1 wherein the piezoelectric domain has a piezoelectric coefficient $d_{31}$ of at least about 60 pC/N and a piezoelectric coefficient $d_{33}$ of at least about 50 p C/N.

22. The acoustic fabric of claim 1 wherein the population of inorganic piezoelectric particles dispersed in the microscopic non-centrosymmetric crystalline piezoelectric material comprises between about 15 wt % and about 25 wt % $BaTiO_3$ particles.

23. The acoustic fabric of claim 1 wherein said at least one charge collector domain comprises two charge collector domains, including a first charge collector domain directly adjacent to a first surface of the piezoelectric domain and a second charge collector domain directly adjacent to a second surface of the piezoelectric domain opposite the first surface, each of the first and second charge collector domains comprising a polymer-based domain selected from carbon-loaded polyethylene, carbon-loaded polycarbonate, and carbon loaded styrene-ethylene-butylene-styrene.

24. The acoustic fabric of claim 1 wherein the at least one electrical conductor comprises at least two electrical conductors, and wherein each electrical conductor is embedded in a charge collector domain.

25. The acoustic fabric of claim 1 wherein the at least one electrical conductor comprises a copper wire.

26. The acoustic fabric of claim 1 wherein the acoustic energy transmission material is a material selected from poly(styrene-b-(ethylene-co-butylene)-b-styrene), a two-phase block copolymer of a polydimethylsiloxane phase and an aliphatic isocyanate phase, a cyclic olefin copolymer elastomer, and a semicrystalline cyclic olefin copolymer elastomer.

27. An acoustic fiber transducer comprising:

a piezoelectric domain disposed between a first end and a second end of the acoustic fiber transducer, the piezoelectric domain including a piezoelectric material that is in a microscopic non-centrosymmetric crystalline phase and including a population of inorganic piezoelectric particles dispersed in the microscopic non-centrosymmetric crystalline piezoelectric material, the piezoelectric domain having a Young's modulus, $E_{piezo}$;

at least one charge collector domain in electrical connection with said piezoelectric domain and including an electrically conductive material operative to collect electrical charge generated in said piezoelectric domain;

at least one electrical conductor in electrical contact with said at least one charge collector domain and including an electrically conductive material operative to transport electrical charge from said at least one charge collector domain to at least one of said first and second ends of said acoustic fiber transducer as an output of an electrical signal indicative of input acoustic sound pressure on the acoustic fiber transducer; and an outer electrically insulating acoustic energy transmission material encapsulating said piezoelectric domain, said charge collector domain, and said electric conductor between the first and second ends of the acoustic fiber transducer, said acoustic energy transmission material having a Young's modulus $E_{trans}$, greater than about 0.3 Pa and less than about 500 MPa, and wherein a ratio of $E_{piezo}/E_{trans}$ is between about 5 and about 70,000.

28. The acoustic fiber transducer of claim 27 wherein the ratio of $E_{piezo}/E_{trans}$ is greater than that for a sensitivity of at least about 1 mV in the output electrical signal for input acoustic sound pressure of no more than about 100 dB on the acoustic fiber transducer.

29. The acoustic fiber transducer of claim 27 wherein the ratio of $E_{piezo}/E_{trans}$ is between about 1 and about 10,000.

30. The acoustic fiber transducer of claim 27 wherein the ratio of $E_{piezo}/E_{trans}$ is between about 10 and about 2,000.

31. The acoustic fiber transducer of claim 27 wherein the piezoelectric material that is in a microscopic non-centrosymmetric crystalline phase comprises P(VDF-TrFE) including between about 20 mol % and 45 mol % TrFE.

32. The acoustic fiber transducer of claim 27 wherein the piezoelectric domain has a weight fraction of piezoelectric β phase at least about 40%.

33. The acoustic fiber transducer of claim 27 wherein the piezoelectric domain has a piezoelectric domain viscosity that is at least about $10^4$ Pa·s less than a charge collector viscosity of the at least one charge collector domain at a common draw temperature of the piezoelectric domain and the charge collector domain.

34. The acoustic fiber transducer of claim 27 wherein the acoustic fiber transducer has a neutral axis of strain in a cross section of the acoustic fiber transducer and wherein the piezoelectric domain, the at least one charge collector domain, and the at least one electrical conductor are disposed together at a site in the acoustic fiber transducer cross section that is between about ten microns and about 500 microns distant from the neutral axis of strain.

35. The acoustic fiber transducer of claim 27 wherein the piezoelectric domain has a piezoelectric coefficient $d_{31}$ of at least about 60 pC/N and a piezoelectric coefficient $d_{33}$ of at least about 50 pC/N.

36. The acoustic fiber transducer of claim 27 wherein the population of inorganic piezoelectric particles dispersed in the microscopic non-centrosymmetric crystalline piezoelectric material comprises between about 15 wt % and about 25 wt % $BaTiO_3$ particles.

37. The acoustic fiber transducer of claim 27 wherein said at least one charge collector domain comprises two charge collector domains, including a first charge collector domain directly adjacent to a first surface of the piezoelectric domain and a second charge collector domain directly adjacent to a second surface of the piezoelectric domain opposite the first surface, each of the first and second charge collector domains comprising a polymer-based domain selected from carbon-loaded polyethylene, carbon-loaded polycarbonate, and carbon loaded styrene-ethylene-butylene-styrene.

38. The acoustic fiber transducer of claim 27 wherein the at least one electrical conductor comprises at least two copper wires, and wherein each electrical conductor is embedded in a charge collector domain.

39. The acoustic fiber transducer of claim 27 wherein the piezoelectric domain disposed between a first end and a second end of the acoustic fiber transducer, has a length of at least about 10 meters.

40. The acoustic fiber transducer of claim 27 wherein the acoustic energy transmission material is a material selected from poly(styrene-b-(ethylene-co-butylene)-b-styrene), a two-phase block copolymer of a polydimethylsiloxane phase and an aliphatic isocyanate phase, a cyclic olefin copolymer elastomer, and a semicrystalline cyclic olefin copolymer elastomer.

* * * * *